United States Patent [19]
Kobayashi et al.

[11] Patent Number: 5,728,635
[45] Date of Patent: Mar. 17, 1998

[54] ALUMINUM NITRIDE SINTERED BODIES

[75] Inventors: Hiromichi Kobayashi, Yokkaichi; Yuki Bessho, Nishikasugai-gun; Yukimasa Mori, Nagoya, all of Japan

[73] Assignee: NGK Insulators, Ltd., Japan

[21] Appl. No.: 691,915

[22] Filed: Aug. 1, 1996

[30] Foreign Application Priority Data

| Aug. 3, 1995 | [JP] | Japan | 7-218158 |
| Aug. 4, 1995 | [JP] | Japan | 7-218256 |
| Aug. 4, 1995 | [JP] | Japan | 7-218257 |
| Jul. 19, 1996 | [JP] | Japan | 8-207556 |

[51] Int. Cl.$^6$ .................................................. C04B 35/581
[52] U.S. Cl. ........................... 501/98.4; 501/96; 264/65
[58] Field of Search ......................... 501/96, 96.1, 98.4; 264/65

[56] References Cited

U.S. PATENT DOCUMENTS

| 4,540,673 | 9/1985 | Takeda et al. | 501/96 |
| 4,578,364 | 3/1986 | Huseby et al. | 501/98 |
| 4,585,706 | 4/1986 | Takeda et al. | 501/96 |
| 4,833,108 | 5/1989 | Mizuno et al. | 501/96 |
| 4,847,221 | 7/1989 | Horiguchi et al. | 501/98 |
| 4,908,173 | 3/1990 | Schwetz et al. | 264/63 |
| 5,077,244 | 12/1991 | Iyori et al. | 501/96 |
| 5,096,863 | 3/1992 | Fukushima | 501/98 |
| 5,449,648 | 9/1995 | Nakahata et al. | 501/96 |
| 5,459,113 | 10/1995 | Nozaki et al. | 501/96 |
| 5,482,905 | 1/1996 | Nakahata et al. | 501/96 |
| 5,529,962 | 6/1996 | Nakahata et al. | 501/96 |
| 5,571,757 | 11/1996 | Groen et al. | 501/87 |
| 5,641,718 | 6/1997 | Horiguchi et al. | 501/96.1 |

FOREIGN PATENT DOCUMENTS

| 0 237 072 A2 | 9/1987 | European Pat. Off. |
| 0 237 072 A3 | 9/1987 | European Pat. Off. |
| 0 267 623 A2 | 5/1988 | European Pat. Off. |
| 0 267 623 A3 | 5/1988 | European Pat. Off. |
| 0 321 975 A1 | 6/1989 | European Pat. Off. |
| 0 470 501 A2 | 2/1992 | European Pat. Off. |
| 0 470 501 A3 | 2/1992 | European Pat. Off. |
| 0 743 290 A1 | 11/1996 | European Pat. Off. |
| 3-261131 | 11/1991 | Japan |
| 5-101871 | 4/1993 | Japan |
| 5-64697 | 9/1993 | Japan |

OTHER PUBLICATIONS

Database WPI, Section Ch, Week 08, Derwent Publications, Ltd., London, GB; Class L03, AN 91-054699, XP002031961 7 JP 03 005 375 A (Toshiba Co. Ltd.), Jan. 11, 1991 — abstract.

Database WPI, Section Ch, Week 29, Derwent Publications Ltd., London, GB; Class L02, AN 94-238538 XP002031962 & JP 03 172 040 A (Asahi Glass Co. Ltd.), Jun. 21, 1994 — abstract.

Database WPI, Section Ch, Week 37, Derwent Publications Ltd., London, GB; Class L02, AN 88-261048 XP002031963 & JP 63 190 133 A (Ibiden Co. Ltd.), Aug. 5, 1988 — abstract — and JP 05 064 697 B Sep. 16, 1993.

*Primary Examiner*—Mark L. Bell
*Assistant Examiner*—Louis M. Troilo
*Attorney, Agent, or Firm*—Parkhurst & Wendel

[57] ABSTRACT

An aluminum nitride sintered body is characterized by having a g-value of an unpaired electron in a spectrum of an electron spin resonance being not less than 2.0010. The aluminum nitride sintered body is produced by sintering a raw material composed of powdery aluminum nitride at a temperature of not less than 1730° C. to not more than 1920° under a pressure of not less than 80 kg/cm$^2$.

27 Claims, 26 Drawing Sheets

FIG_1

FIG_2

FIG_3

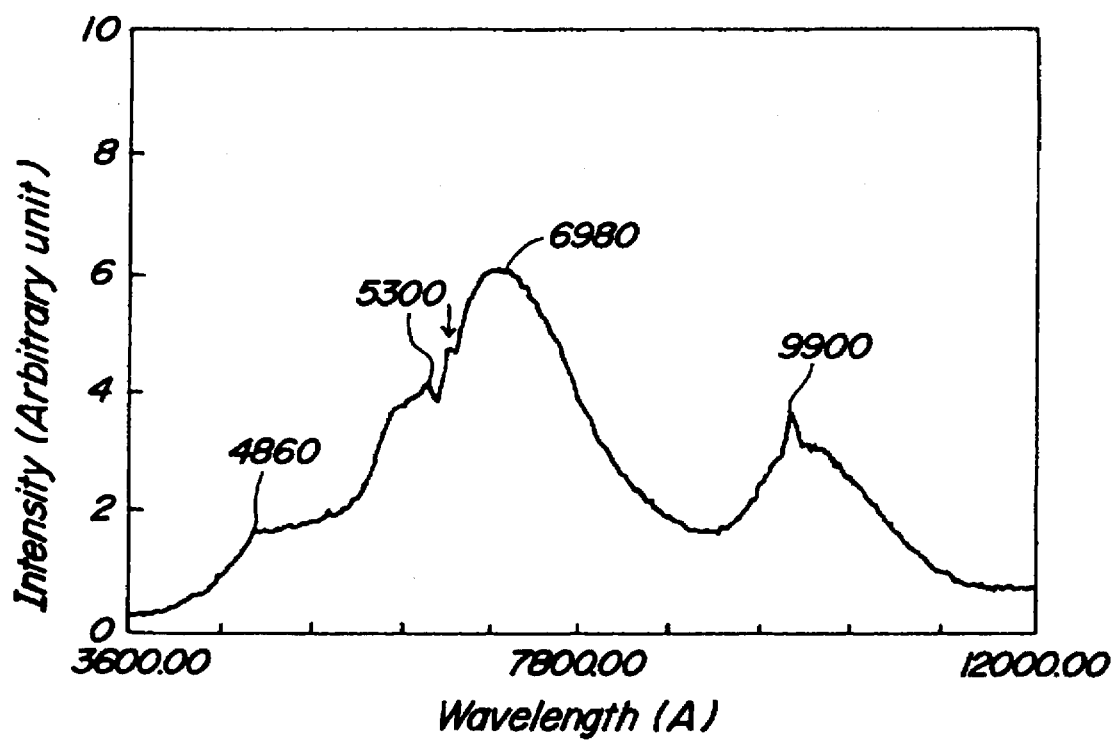
FIG_12

FIG._15

FIG_17

ALUMINUM NITRIDE SINTERED BODIES

BACKGROUND OF THE INVENTION

(1) Field of the Invention

The present invention relates to aluminum nitride bodies and an apparatus for producing semiconductors using such aluminum nitride bodies as substrates. The invention also relates to aluminum nitride sintered bodies and the production process thereof as well as to an apparatus for producing semiconductors using such aluminum nitride sintered bodies as substrates.

(2) Related Art Statement

In semiconductor-producing apparatuses such as etching apparatuses or chemical gas phase growing apparatuses, so-called stainless heaters or indirect-heating type heaters have been generally used. However, if such heat sources are employed, particles may be produced by the action of a halogen-based corrosive gas and a heat efficiency is poor. In order to solve those problems, NGK Insulators disclosed a ceramic heater in which a wire made of a high melting point metal is buried inside a dense ceramic substrate (JP-A 3-261131). This wire is sprailly coiled inside the discoidal substrate, and terminals are connected to the opposite ends of the wire. It has been discovered that such a ceramic heater has excellent characteristics suitable particularly for use in the production of semiconductors.

It is considered that nitride-based ceramics such as silicon nitride, aluminum nitride, and sialon are preferred as ceramics constituting substrates for the ceramic heaters. Further, a susceptor is sometimes placed on the ceramic heater, and a seminconductor wafter placed on the susceptor is heated. NGK Insulators, Ltd. disclosed that aluminum nitride is preferred as substrates for such ceramic heaters and susceptors (JP-A 5-101871). Particularly in the semiconductor-producing apparatuses, halogen-based corrosive gases such as $ClF_3$ gas are often used as an etching gas or a cleaning gas. The reason why aluminum nitride is preferred is based on confirmation that aluminum nitride has extremely high corrosion resistance against such halogen-based corrosive gases.

An aluminum nitride sintered body itself generally exhibits white or whitish gray. However, it is desired that the substrate to be used as the above-mentioned heater or susceptor is black, because the black substrate has a greater radiation heat capacity and a better heating characteristic as compared with the white ones. Further, if the white or gray substrate is used in the above heater or the susceptor, uneven color is unfavorably likely to appear at the surface thereof. Therefore, some improvement has been demanded. Further, customers prefer blackish brown, or blackish gray substrates and the like having a high black degree and a low lightness than the whitish or gray substrates.

In order to make an aluminum nitride sintered body black, it is known that an appropriate elementary metal or a metal compound (a blacking agent) is added into a powdery raw material, and a black aluminum nitride sintered body is produced by firing the resulting mixture (JP-B 5-64697). Such an additive, tungsten, titanium oxide, nickel, vanadium, etc. are known.

However, if an elementary metal or a metallic compound is incorporated into an aluminum nitride sintered body as a blacking agent, the content of metallic impurities in the aluminum nitride sintered body naturally becomes larger due to the incorporation of the additive. Particularly, if a Ia group element, a I element and/or a transition metal element exists in the aluminum nitride sintered body in the semiconductor-producing process, such element(s) adversely afford serious problem upon the semiconductor wafer or the semiconductor-producing apparatus, even if the content thereof is very small. For example, this may cause a defect in the semiconductor. Therefore, it has been demanded to decrease the lightness of the aluminum nitride sintered body without incorporating the above blacking agent therein.

DISCLOSURE OF THE INVENTION

It is an object of the present invention to decrease the lightness of an aluminum nitride sintered body and to approach its color to black without incorporating a metal or a metallic compound or a heavy metal or a heavy metal compound, for example, a sintering aid or a blacking agent thereinto.

Further, it is another object of the present invention to provide a semiconductor-producing apparatus having a radiation efficiency and a high commercial value by using a substrate with such an increased degree of black.

The aluminum nitride sintered body according to one embodiment of a first aspect of the present invention is characterized in that a g-value of an unpaired electron in a spectrum of an electron spin resonance (ESR spectrum) of the aluminum nitride sintered body is not less than 2.0010.

Further, the aluminum nitride sintered body according to another embodiment of the first aspect of the present invention is characterized in that a spin amount per a unit mg of aluminum in a spectrum of an electron spin resonance of the aluminum nitride sintered body is not more than $5 \times 10^{12}$ spin/mg.

According to the semiconductor-producing apparatus of the first aspect of the present invention, the aluminum nitride sintered body satisfying at least one of the above characteristics is used as a substrate.

The aluminum nitride sintered body according to a second aspect Of the present invention is characterized in that a ratio, $I(133)/I(680)$, between a height $I(133)$ of a peak at 133 $cm^{-1}$ and that $I(680)$ of a peak at 680 $cm^{-1}$ in a measurement spectrum of a laser-Raman spectroscopy of the aluminum nitride sintered body is not less than 0.3.

According to the semiconductor-producing apparatus of the second aspect of the present invention, the aluminum nitride sintered body satisfying at least one of the above characteristic is used as a substrate.

The aluminum nitride sintered body according to a third aspect of the present invention is characterized in that a peak of carbon is detected at an X-ray diffraction angle $2\theta=44°$ to $45°$ in an X-ray diffraction chart of the aluminum nitride sintered body in addition to a peak of aluminum nitride as a main crystalline phase.

According to the semiconductor-producing apparatus of the third aspect of the present invention, the aluminum nitride sintered body satisfying at least one of the above characteristic is used as a substrate.

The present invention also relates to a process for producing an aluminum nitride sintered body by sintering a raw material composed of powdery aluminum nitride containing 500 ppm to 5000 ppm of carbon in a temperature range of not less than 1730° C. to not more than 1920° C. under pressure of not less than 80 $kg/cm^2$.

BRIEF DESCRIPTION OF THE DRAWINGS

FIG. 12 is a spectrum of the photoluminesence of a yellowish portion of an aluminum nitride sintered body having a low lightness obtained by thermal treatment;

BEST MODE FOR CARRYING OUT THE INVENTION

Figure 1:
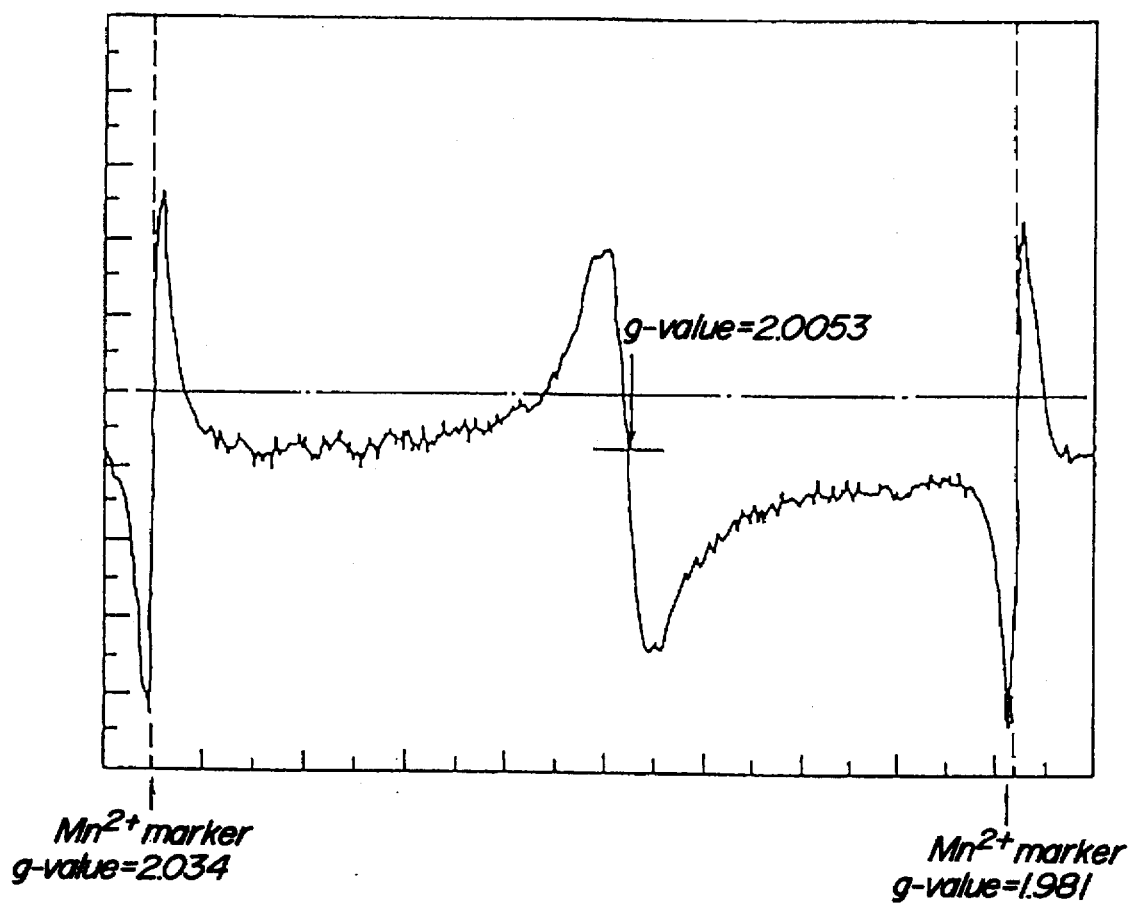
FIG. 1 is a spectrum of an electron spin resonance (ESR spectrum) of a blackish brown aluminum nitride sintered body according to one embodiment of the first aspect of the present invention.

According to the present invention, the "lightness" means the following.

The color of the surface of an object is expressed by three attributes in perception of a color, i.e., the hue, the lightness, and the chroma. Among them, the lightness is a scale for indicating an attribute in visual sight so as to judge whether a reflecting percentage at the surface of the object is large or small. The ways of indicating the scales of these three attributes are specified in JIS Z 8721. The lightness V is determined based on the achromatic color, a standard that the lightness of ideal black is 0, and that of ideal white is 10. A color area between the ideal black and the ideal white is divided into 10 zones indicated by symbols of N 0 to N 10 which vary stepwise by an equal degree of the lightness in color perception. The lightness of an actual aluminum nitride sintered body is determined by comparing the color of the surface of the sintered body with color chips corresponding to N 0 to N 10, respectively. At that time, the lightness is principally determined up to the first decimal place, and 0 or 5 is taken as a figure at the first decimal place.

The relative density of the aluminum nitride sintered body is a value defined by an equation of (relative density=bulky density/theoretical density), and the unit of the relative density is %.

As a semiconductor-producing apparatus using the aluminum nitride sintered body according to the present invention as a substrate, a ceramic heater in which a resistive heater is buried in a substrate made of the aluminum nitride sintered body, a ceramic electrostatic chuck in which an electrostatically chucking electrode is buried in a substrate, a heater with an electrostatic chuck in which a resistive heater and an electrostatically chucking electrode are buried in a substrate, and an active type apparatus, for example, a high frequency wave generating electrode apparatus in which a plasma-generating electrode is buried in a substrate may be recited.

Further, various semiconductor-producing apparatuses such as a susceptor for placing a semiconductor wafer thereon, a dummy wafer, a shadow ring, a tube for generating a high frequency plasma, a doom for generating a high frequency plasma, a high frequency wave-permeable window, an infrared radiation-permeable window, a lift pin for supporting a semiconductor wafer, and a shower plate may be recited.

The thermal conductivity of the aluminum nitride sintered body is preferably not less than 90 W/m·K when in use for the substrate in the heating member such as the ceramic heater, the heater with the electrostatic chuck, or the semiconductor wafer-holding susceptor.

Next, the first aspect of the present invention will be explained.

During the course of investigating the aluminum nitride sintered bodies, the present inventors have succeeded in producing blackish gray to blackish brown aluminum nitride sintered bodies having an extremely low lightness which contained almost no metallic element such as a blacking agent other than aluminum and exhibited the lightness specified in JIS Z 8721 being not more than 4.

Since those aluminum nitride sintered bodies exhibit black colors having the lightness specified in JIS Z 8721 being not more than 4, its radiation heat amount is large and its heating characteristic is excellent. Therefore, the above aluminum nitride sintered bodies are suitable as substrates constituting the heating members such as the ceramic heater, the susceptor, etc. In addition, since the content of the metal elements excluding aluminum can be largely reduced, contamination of the semiconductors needs not be feared. In particularly, it is not feared that an adverse effect is afforded upon the semiconductor wafer or the semiconductor-producing apparatus in the semiconductor-producing process. In addition, no uneven color clearly appears at the surface of the aluminum nitride sintered body according to the present invention, so that the appearance of the aluminum nitride sintered body is extremely excellent. In addition, since the degree of black of the sintered body is high, its commercial value is largely enhanced.

With respect to aluminum nitride sintered bodies obtained as mentioned above, the present inventors have investigated the reason why the sintered bodies were colored deeply black with low lightness. As a result, the inventors have discovered that the aluminum nitride sintered bodies satisfying the specific requirement mentioned later have decreased lightness and progressed black. The inventors accomplished the present invention based on the above knowledge.

First, the X-ray diffraction analysis of the aluminum nitride sintered bodies exhibiting a blackish brown color to a blackish gray color with the lightness of not more than 4 revealed that their main crystalline phase was AlN and AlON was produced as an auxiliary crystalline phase. In such an aluminum nitride sintered sample, AlON grains having the grain diameters of around 0.1 μm were typically produced in AlN crystal grains having the grain diameters of 1 to 3 μm. For example, under condition mentioned later, aluminum nitride sintered samples produced by sintering powdery aluminum nitride having a purity of not less than 99.9 wt % at 1750° C. to 1900° C. exhibited blackish brown or blackish gray with lightness N 3 to N 4. On the other hand, aluminum nitride sintered samples produced by sintering powdery aluminum nitride having a purity of not less than 99.9 wt % at 1950° C. exhibited yellowish.

The analysis of the crystalline tissue of the sample obtained by sintering at 1950° C. revealed that a so-called 27R phase ($Al_2O_3$—7(AlN) phase) was produced besides the AlN main crystalline phase. The grain size of the AlN crystalline phase was around 2 μm to 4 μm, and the above 27R phase was precipitated at the grain boundary thereof. According to a known $Al_2O_3$—AlN phase diagram, the crystalline phase produced in the sintering changes at a boundary of 1920° C. Therefore, the above difference in the crystalline phase is considered to be based on that in the sintering temperature.

When the above sample having a low lightness was heated at 1900° C. in a nitrogen atmosphere, its original blackish blown color portions or blackish gray color portions disappeared, and gray color portions and yellowish white portions were produced. In the gray portion, a spherical AlON crystalline phase and an $Al_2OC$—AlN phase were produced. In the yellowish white portion, almost no 27R phase was seen, and mainly the AlON phase existed. Further, no difference was observed in the lattice constant of AlN for every hue of the aluminum nitride sintered bodies. That is, no particular correlation was seen between the kinds of the crystalline phases besides the AlN crystalline phase and the hue or the lightness. Therefore, it is considered that the change in the hue of the aluminum nitride sintered body is based not on the kind of the crystalline phase but on a defect structure inside the AlN crystalline phase or the defect structure of the grain boundary.

In order to know the construction of the defect structure of the AlN crystalline phase or the grain boundary mentioned above, a spectrum was obtained in the electron spin resonance: ESR) with respect to each sample. This principle will be briefly explained. The energy level of an unpaired electron is split under a magnetic field by the Zeeman effect. The interaction between the electron orbit motion and the nearby atom nuclear magnetization efficiency sensitively reacts to the above energy levels. According to the ESR, information on atoms, chemical bonds, etc. nearby an atom with an unpaired electron can be known by measuring the energy levels cleaved split.

With respect to the above black sintered body having not more than the lightness N 4 and the gray portion and the yellowish portion of the sintered body obtained by the thermal treatment, ESR spectra were measured. In the aluminum nitride sintered body, the spin amount of the unpaired electron of aluminum varies depending upon a crystalline field in which the unpaired electron exists. The spin amount is theoretically 2.0000 for a free electron, and takes a value g=2.002316 when corrected by the theory of relativity. The Al atom and the N atom in the AlN crystalline phase take a 4-coordinated wurtzite structure in which a $sp^3$ hybrid orbit is formed by an aluminum atom and three nitrogen atoms. It can be known from the spin amount of each sample that which crystalline coordination the unpaired electron in the lattice defect exists in or what element exists around the unpaired electron.

Figure 2:
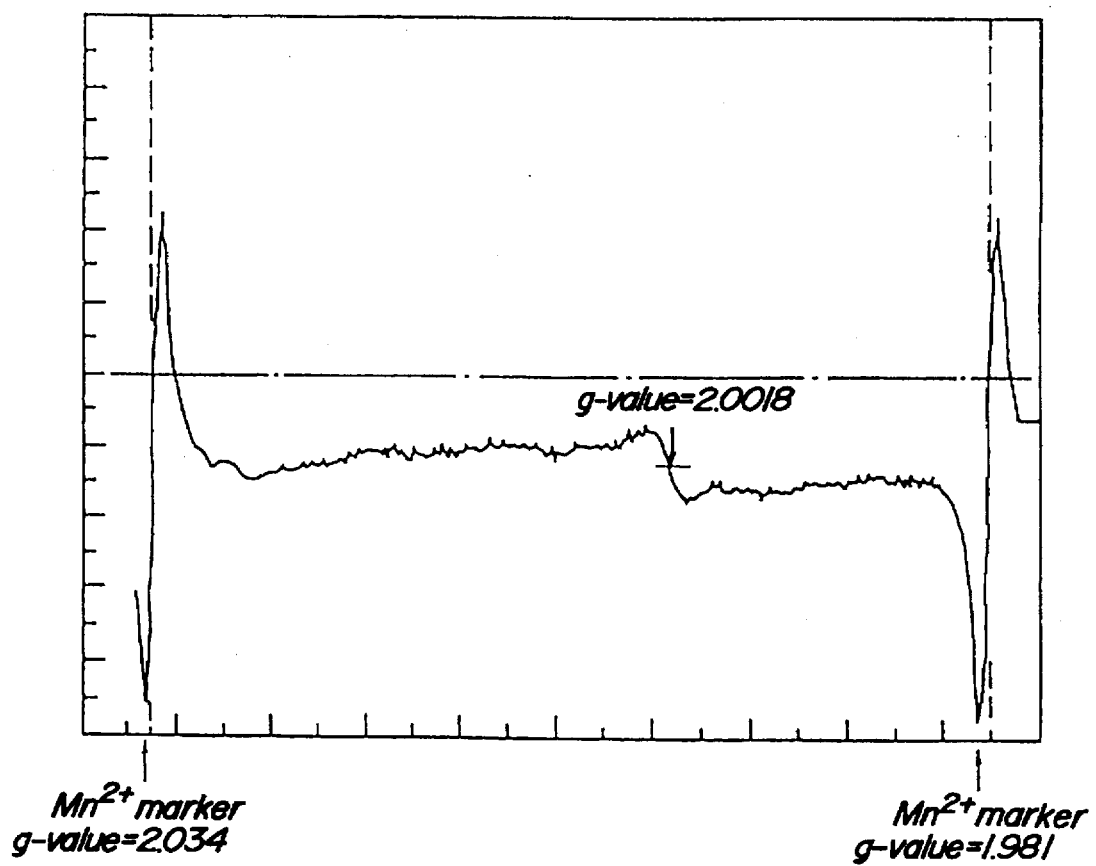
FIG. 2 is an ESR spectrum of a gray portion of the above blackish brown aluminum nitride sintered body obtained by thermal treatment in a nitrogen atmosphere.
Figure 3:
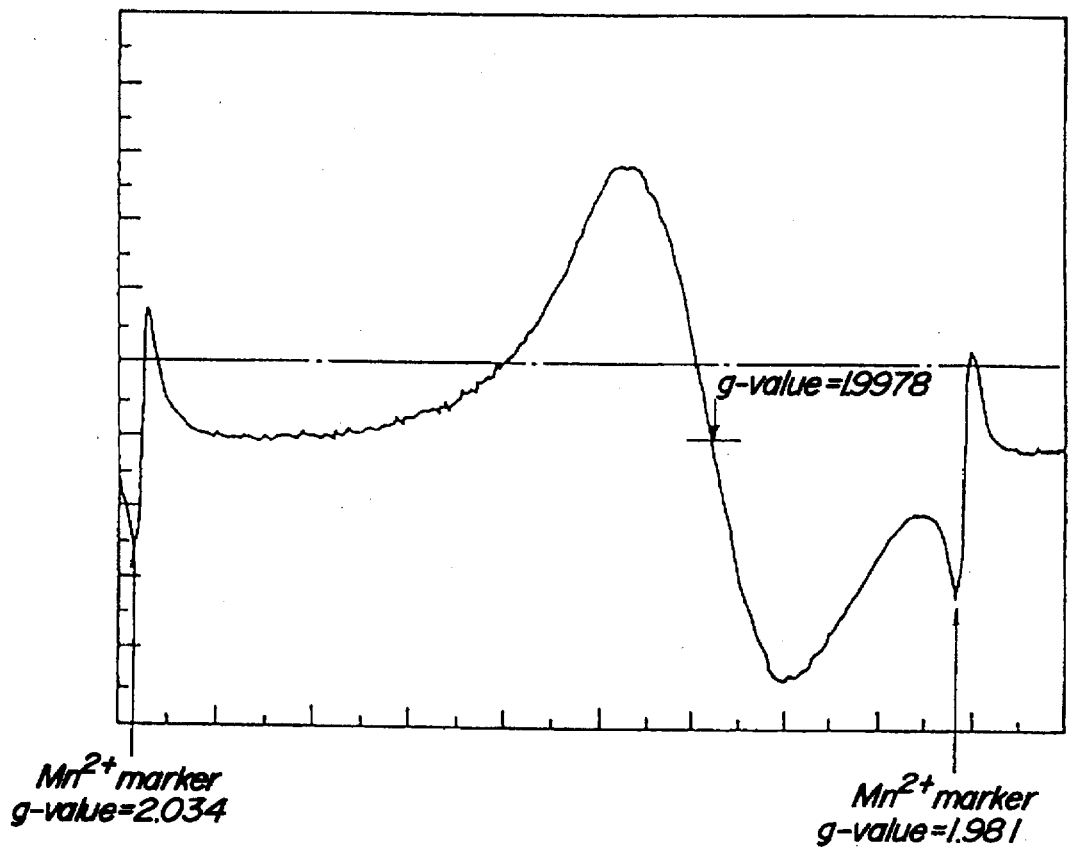
FIG. 3 is an ESR spectrum of a yellowish white portion of the above blackish brown aluminum nitride sintered body obtained by thermal treatment in a nitrogen atmosphere.

FIG. 1 is an ESR spectrum of the above-mentioned blackish brown aluminum nitride sintered body, FIG. 2 is an ESR spectrum of the gray portion, and FIG. 3 is an ESR spectrum of the yellowish white portion. From those data, the g-value of the spin amount of the blackish brown aluminum nitride sintered body was 2.0053±0.0001, its peak intensity was high and the peak was sharp. The spin amount per unit mg of its aluminum was $7.9 \times 10^{11}$ spin/mg. In the gray portion, the g-value of the spin amount was 2.0018±0.0001, and its peak intensity was low. The spin amount per unit mg of its aluminum was $2.1 \times 10^{12}$ spin/mg. In the yellowish white portion, the g-value of the spin amount was 1.9978±0.0001, its peak intensity was high, and the peak profile was broad. The spin amount per unit mg of its aluminum was $1.5 \times 10^{13}$ spin/mg.

If the kind of atom bonded to the Al atom having the unpaired electron changes, the spin amount (g-value) of the unpaired electron largely varies. This large change of the g-value should be attributable to the change in the kind of the atom bonded to the aluminum. Regarding the four-coordinated structure Si atom, it is reported that the spin amount similarly changes (See "ESR evaluation of materials" published by IPC, p 57). It is considered that the conspicuous change in the g-value measured above was attributable to the change in the kind of the atoms four-coordinated to the aluminum atom, that is, aluminum atoms are bonded to the aluminum atom.

Figure 4:
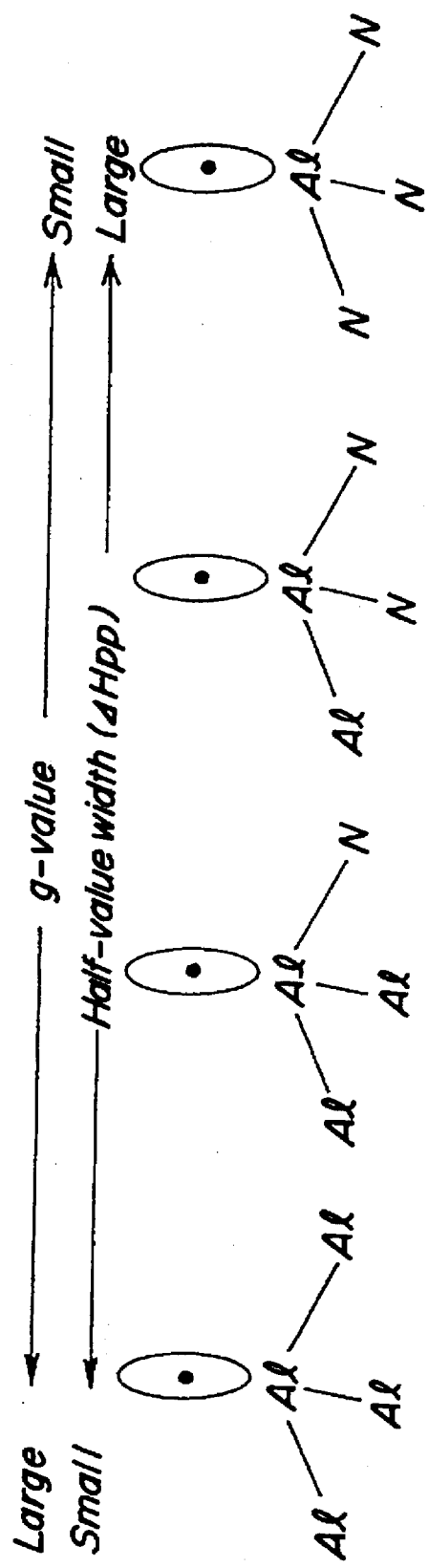
FIG. 4 is a concept illustration explaining a bonded state of aluminum atoms and other atoms and the g-value in the ESR spectrum.

That is, as shown in FIG. 4, when three nitrogen atoms are coordinated to the aluminum and if one or more nitrogen atoms coordinated to the aluminum are replaced by aluminum atom or atoms, the above g-value becomes greater, and a half-value width becomes smaller. The width of the peak becomes smaller, and the peak becomes sharp.

It can be understood that if the number of nitrogen atom or atoms coordinated to the aluminum changes, the g-value changes. Since carbon atoms and oxygen atoms exist in the Al crystalline phase, it can be considered that the above nitrogen atom or atoms are replaced by carbon atom or atoms or oxygen atom or atoms. When the carbon atom or atoms or the oxygen atom or atoms enter the location or locations of the nitrogen atom or atoms, the g-value becomes smaller. Therefore, the percentage at which the nitrogen atom or atoms are replaced by carbon or oxygen atom or atoms must be extremely low.

In the yellowish white portion, as mentioned above, the g-value is less than 2.0000, the peak is broad, and the half-value width is large. In such a sample, it is considered that oxygen solid-solved into the AlN crystal, that is, the $N^{+3}$ site in the AlN crystal is substituted by $O^{2-}$ and $Al^{3+}$ is missing, that a color center is formed by an unpaired electron trapped in this lattice defect and a yellowish white color is exhibited by remarkably absorbing a light on a short wavelength side of the visible light, and that the $N^{3+}$ is replaced by two oxygen ion sand a color center is formed by $O^{2-}$.

So the contrary, the g-value of the peak in the blackish brown sintered body is large, and the peak is sharp. In the blackish gray sintered body, almost the same result as this is obtained. A slight difference in hue in a level not more than a lightness N 4 is not essential. As mentioned above, although the Al—Al bond is formed in the aluminum nitride sintered body having low lightness, it is considered that this bond has such a metallic bond as to absorb a visible light having continuous wavelengths over a wide zone, so that the lightness of the aluminum nitride sintered body is lowered.

It was made clear that the electric resistances of the blackish brown sample and the blackish gray sample are greater than that of the yellowish white portion by about an order of two figures. When the absorbing peaks themselves are compared in the ESR spectra of the samples, the yellowish white sample has the greatest absorption intensity and a wide half-value width. This is considered in that the largest number of conductive electrons are trapped or captured by the above lattice defect as the color center, and the thus trapped conductive electrons contribute to reduction in the electric resistance.

With respect to each of the other samples, an ESR spectrum was measured in the above manner. As a result, it was confirmed that in order to obtain a blackish brown or blackish gray sample (sample having lightness N4 or less), its g-value needs to be not less than 2.0040. In order to stably obtain a sample having such a low lightness, it is preferable to set the g-value at not less than 2.0050.

With respect to the gray portion of the blackish brown sample produced by the thermal treatment among the above samples, an ESR spectrum shown in FIG. 2 was obtained, and its g-value was 2.0018±0.0001. This has the g-value slightly smaller than those of the blackish brown sample, etc. but far greater than those of the ordinary white to milky white aluminum nitride sintered bodies and the above yellowish white aluminum nitride sintered body. It was microscopically confirmed that the lightness was relatively reduced in lightness.

However, it was made clear that $(AlN)_x(Al_2OC)_{1-x}$ was slightly produced in the sample at that time. It was clarified that a fine gap or void (fine space) was formed between the AlN crystalline phase, the light was scattered by this void, and the lightness was raised by the scattered light. Therefore, although the effect of the present invention can be confirmed in such a matrix, it is more preferable to prevent the production of the above $(AlN)_x(Al_2OC)_{1-x}$ phase, because the lightness of the aluminum nitride sintered body can be reduced to not more than 4, or further to not more than 3.5 by so doing.

Figure 5:
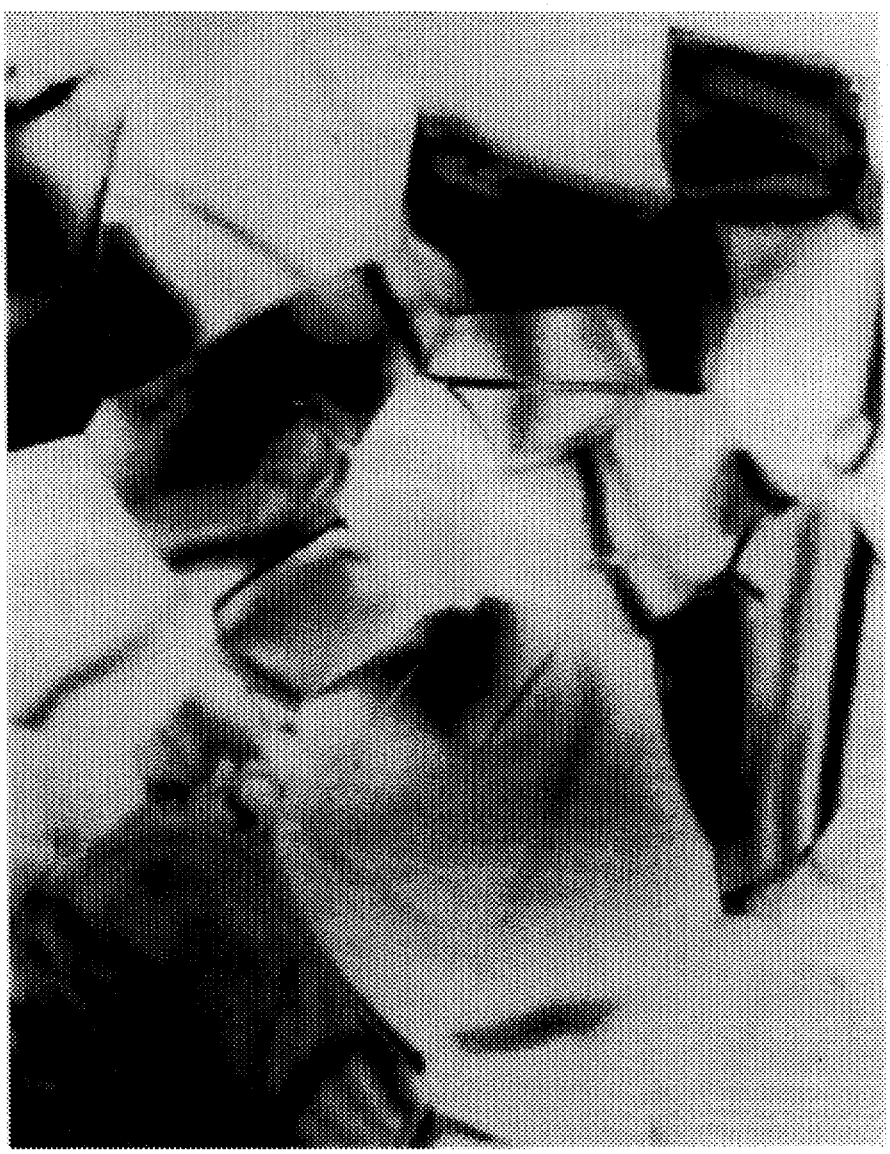
FIG. 5 is an electron microphotograph showing a ceramic tissue of the aluminum nitride sintered body according to the embodiment of the first aspect of the present invention.
Figure 6:
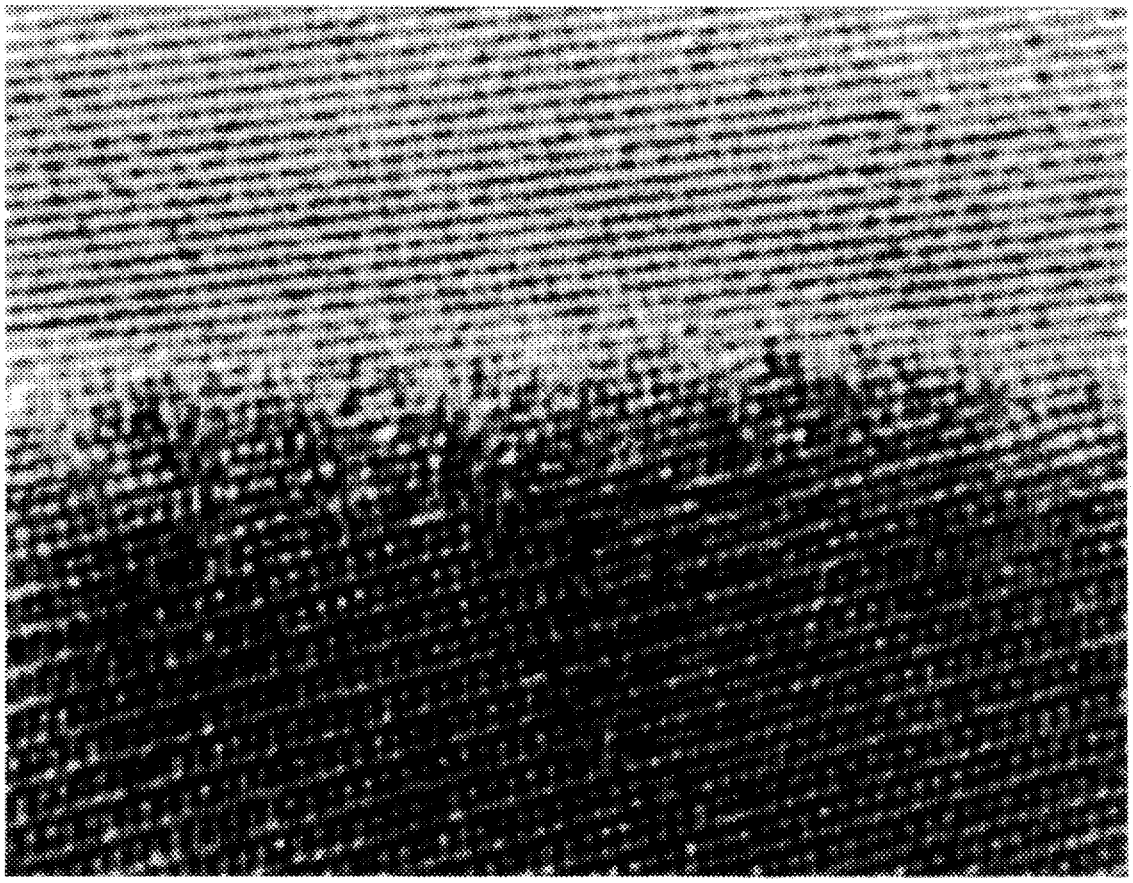
FIG. 6 is an electron microphotograph showing a ceramic tissue near a grain boundary of an AlN crystalline phase of the aluminum nitride sintered body according to one embodiment of the first aspect of the present invention.

FIG. 5 shows the microstructure of the blackish brown aluminum nitride mentioned above. As shown in FIG. 5, fine AlON crystals are present in the AlN crystal grains, and the grain boundary at which the crystals contact has no crystalline grain and is dense with no gap. FIG. 6 is an electron microphotoraph of the blackish brown aluminum nitride sintered sample in which a grain boundary portion of a crystal composed of AlN is enlarged. No different phase is seen in the grain boundary of the AlN crystal.

Further, the black, dense aluminum nitride sintered body according to the present invention was obtained by decreasing the spin amount per unit mg of aluminum to not more than $5\times10^{12}$ spin/mg in a spectrum of the electron spin resonance of the sintered body. From this point of view, it is preferable to decrease the spin amount per unit mg of aluminum to not more than $1\times10^{12}$ spin/mg, which substantially corresponded to a g-value of 2.0040. Practically speaking, it is preferable to decrease the spin amount per unit mg of aluminum to not less than $1.0\times10^{11}$ spin/mg, and further it is more preferable to decrease the spin amount per unit mg of aluminum to not less than $1.0\times10^{10}$ spin/mg.

The spin amount per unit mg of aluminum was measured by a process described in Hiroaki Ohya and Jun Yamauchi "Electron Spin Resonance" published by Kodansha Co., Ltd. That is, the absorption intensity in the ESR spectrum is proportional to the percentage of unpaired electrons in the crystalline grain of the aluminum nitride. The g-value needs to be quantitatively measured with reference to that of a known g-value of a standard sample. That is, it is necessary that the sample having the known g-value and the aluminum nitride sintered sample according to the present invention are measured under the same condition, absorption curves obtained are converted to integral curves, and areas defined by the integral curves are compared with each other.

The present inventors quantitatively measured a single super fine line of $Mn^{2+}/MgO$ by using a solution of TEMPOL (4-hydroxy-2,2,6,6-tetramethylpyperidine-1-oxyl) having a known spin amount, compared the spin amounts, and calculated a spin amount of the aluminum nitride sintered body from an area ratio at peaks.

A preferred process for the production of the above aluminum nitride sintered body according to the present invention having small lightness will be explained. First, it is preferable to use a powder obtained by a reducing/nitriding process as a raw material composed of powdery aluminum nitride. Addition of a metal element other than aluminum to the raw material composed of powdery aluminum nitride should be avoided, and such a metal element should be preferably suppressed to not more than 100 ppm. The "metal element other than aluminum" includes metallic elements belonging to Groups Ia–VIIa, VIII, Ib and IIb and a part of elements belonging to Groups IIIb and IVb in the Periodic Table (Si, Ga, Ge, etc.).

Preferably, as mentioned above, aluminum nitride powder having a high purity is prepared by the reducing/nitriding process, and molded into a molded body by a uniaxial press molding process or a cold isostatic press process, and the resulting molding is fired in the state that the molding is Wrapped by or sealed in a covering film made of carbon to prevent it from contacting surrounding air. Hot press or hot isostatic press may be employed for this firing process itself.

Figure 8:
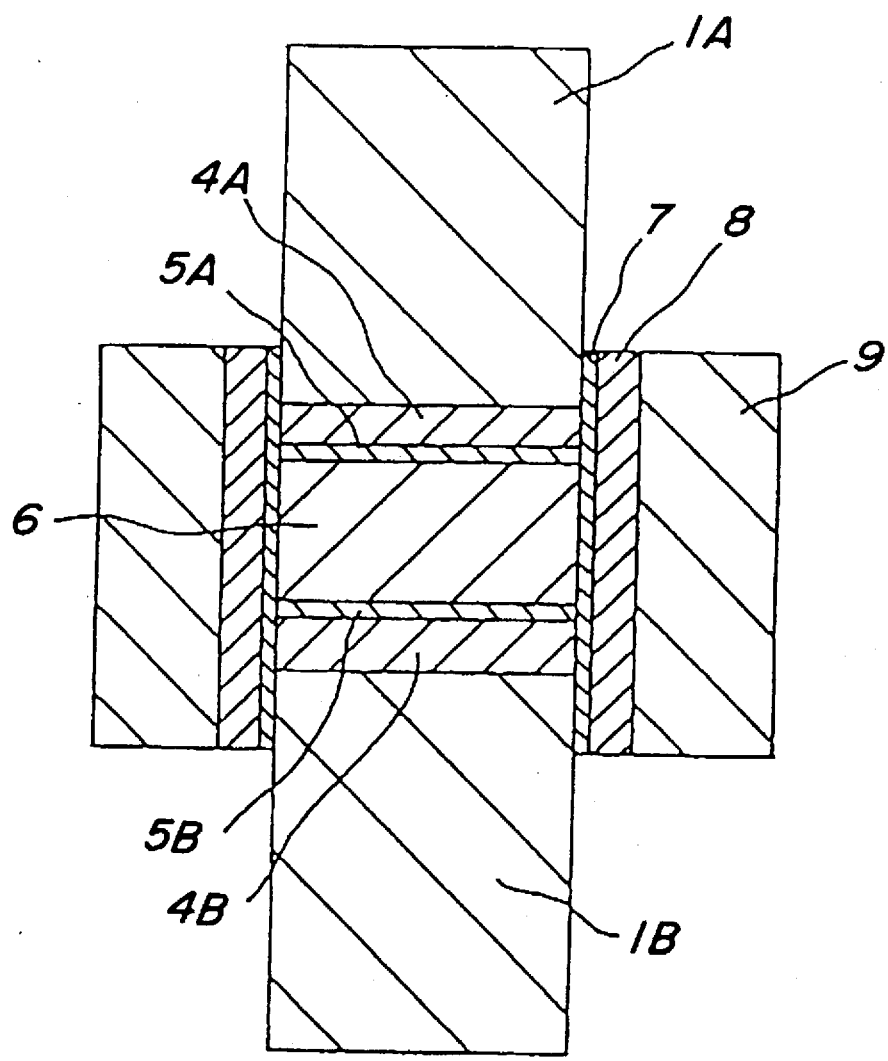
FIG. 8 is a schematically sectional view for illustrating a hot press suitable for the production of the aluminum nitride sintered body according to the present invention.

The molding may be wrapped with the molding in the covering film made of carbon as shown in FIG. 8. That is, when the molding 6 is to be placed between an upper punch 1A and a lower punch 1B, foils 5A and 5B made of graphite are arranged at upper and lower faces of the molding 6, respectively. Then, the molding 6 with a pair of the foils 5A and 5B is placed between spacers 4A and 4B. Graphite foils 7 are placed to cover opposite side faces of the molding 6 so that the molding 6 may be sealed with the graphite foils 5A, 5B and 7. The molding 6 and the foils 7 are placed in a die 9 made of carbon via sleeves 8 made of carbon. By driving a press molding machine, the molding is pressed in vertical directions in FIG. 8 by means of the upper punch 1A and the lower punch 1B under heating.

As mentioned above, when the molding is sealed in the covering film made of a material having a high content of carbon compound or carbon atoms, and treated under heating in the pressurized state, and the atmosphere is controlled as mentioned above, an aluminum nitride sintered body having the above-mentioned aluminum-aluminum bonds and a continuous light adsorbing characteristic over the visible light zone can be produced.

The firing temperature may be set at 1750° C. to 1900° C. The pressure at the time of firing is set at not less than 100 kg/cm², preferably at not less than 150 kg/cm², more preferably at not less than 200 kg/cm². Judging from the capacity of an actual apparatus, the pressure is preferably not more than 0.5 ton/cm².

The present inventors have repeated investigations on the above process in more detail, and reached the following conclusion. As the process for the production of aluminum nitride powder, the reducing/nitriding process and a directly nitriding process are known. Chemical reactions used in these processes are given below.

Reducing/nitriding process:
$Al_2O_3 + 3C + N_2 \rightarrow 2AlN + 3CO$
Direct nitriding process:
i) $Al(C_2H_5) + NH_3 \rightarrow AlN + 3C_2H_6$ (Gas phase process)
ii) $2Al + N_2 \rightarrow 2AlN$ In the reducing/nitriding process, the aluminum nitride crystal is produced by reducing and nitriding a $\gamma$-$Al_2O_3$ phase with carbon. It is considered that the carbon used as a reducing catalyst remains on the surface of the aluminum nitride crystal, and oxygen not removed by reducing or nitriding remains inside the aluminum nitride sintered body. Aluminum nitride is thermodynamically unstable in air, and the content of oxygen particularly in a fine sintering powder having a surface activity increases because it easily reacts with moisture and oxygen in air even at room temperature. Therefore, the aluminum nitride crystal having activity for moisture and oxygen stabilized by covering the oxidizable surface layer with an oxide or a hydroxide. This oxidizing treatment is utilized to remove carbon atoms remaining at the surfaces of the reduced grains to enhance the purity.

Therefore, what are important from the standpoint of the quality of the aluminum nitride crystal are the oxidized film present at the surface of the grain and the content of oxygen solid-solved in the aluminum nitride during the reducing/nitriding step.

When the molding is heated under pressure according to the reducing/nitriding process as mentioned above in the state that the grains are sealed in the carbon film to prevent contact between the oxidizing atmosphere such as surrounding air, the atmosphere inside the covering film is important. An alumina film is present at the surface of the aluminum nitride grain. For example, assume that the atmosphere inside the covering film made of a graphite foil is a reducing atmosphere (nitrogen gas atmosphere) and sintering is effected at a temperature of 1850° C. to 1950° C. under pressure of 250 kg/cm². The partial pressure of oxygen is an order of ppm. CO gas is produced during the firing near the surface of the aluminum nitride grain through a reaction between $Al_2O_3$ and C (carbon) remaining at said surface. The gas phase in this reaction includes Al, AlO, $Al_2O$, $Al_2O_3$, AlC, $AlC_2$, $Al_2C_2$, AlN, NO, and CO.

$3Al_2O_3$ (solid)+AlN (solid)+2C (solid)+7NO (gas)$\rightarrow$2CO (gas)+ 7AlN (gas)

Figure 9:
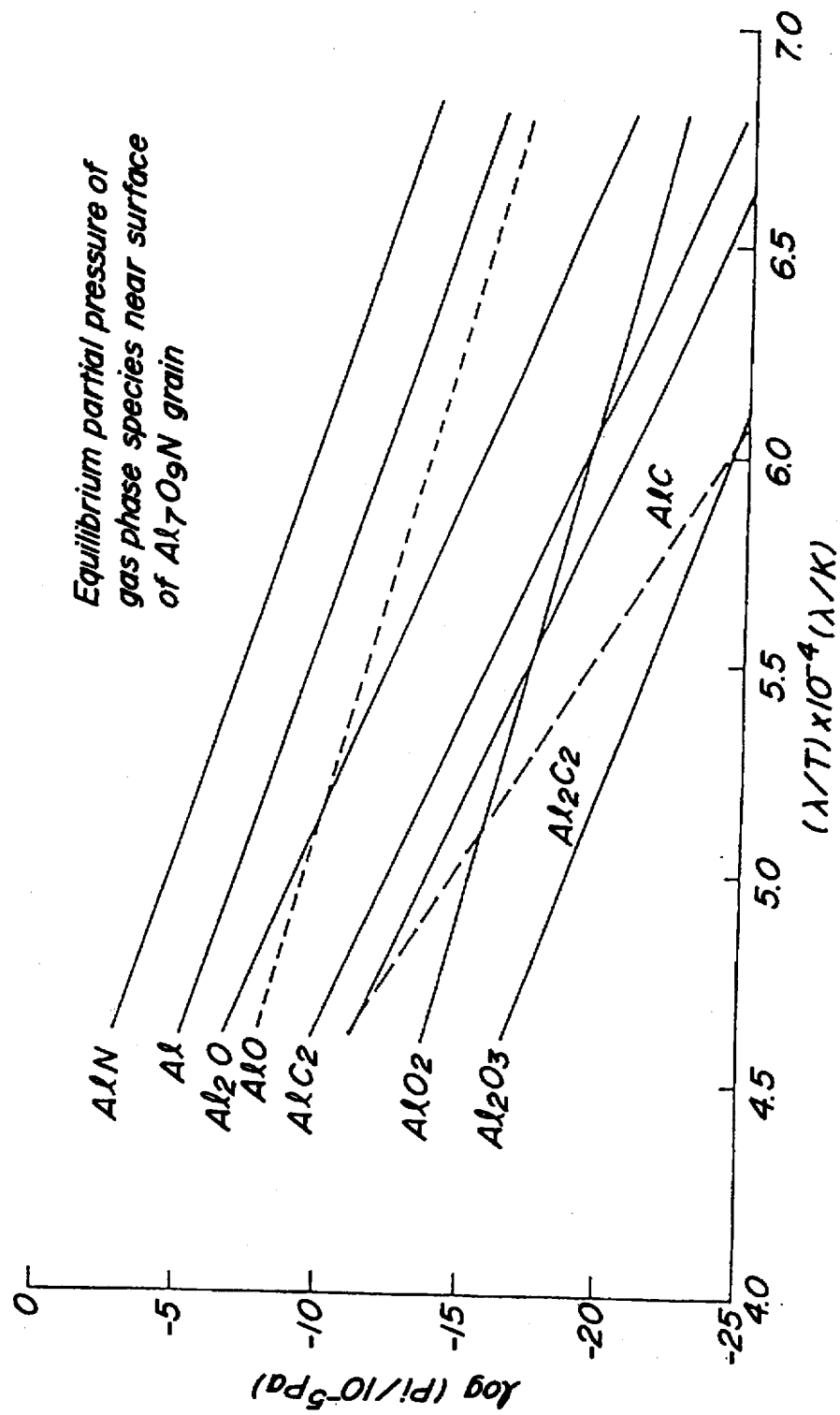
FIG. 9 is a graph illustrating the relationship between $\lambda/T$ and the calculated partial pressure of each of various gas phases near the surface of a grain of the aluminum nitride sintered body in the hot press.

A graph shown in FIG. 9 is obtained by calculating an equilibrium partial pressure of each gas phase in the state that the partial pressure of CO in the sintered body is kept constant. As seen from this graph, the partial pressure becomes lower in the order of AlN, Al, and $Al_2O$. Carbon advances the reducing reaction of $Al_2O_3$ to produce AlN. Further, as seen from the partial pressures of Al and $Al_2O$, it is presumed that the Al—Al bonds and the AlON(AlN+ $Al_2O$) phase containing oxygen are produced in the crystalline lattice. It was made clear through observation of the TEM that the $Al_2OC$ layer existed at the crystalline grain boundary. Therefore, it is considered that the $Al_2OC$ layer is a product (C+$Al_2O$) produced by bonding between carbon remaining on the surface of the aluminum nitride grain and $Al_2O$ in the gas phase.

At not more than 1950° C., the partial pressure of Al is greater than that of $Al_2O$, whereas at more than 1950° C., the partial pressure of Al becomes reversely smaller than that of $Al_2O$. That is, it is considered that the higher the firing temperature, the more is advanced the formation of the $Al_2O$ phase, whereas at not more than 1950° C., the Al—Al bonds are produced.

In the hue of the AlN crystal, the defect structure inside the crystal is important. As mentioned before, this defect structure is mainly influenced by the content of oxygen in the raw material powder, the sintering atmosphere, and the kinds of the gas phase produced in the sintering step. In particular, as mentioned before, it is considered that oxygen and carbon atoms remaining on the surface of the aluminum nitride grain has a large influence and carbon fed into the atmosphere from the graphite foil play a large role. As mentioned before, it is considered that the oxide is reduced with carbon to produce the AlN phase, the Al phase and $ALO_2$ phase so that the AlON phase and the Al—Al bonds may be formed.

In order to stably produce the aluminum nitride sintered body having low lightness, it is preferable to employ the pressure of not less than 150 kg/cm², and more preferable to employ the pressure of not less than 200 kg/cm² in the above-mentioned producing process.

The relative density of the aluminum nitride sintered body is a value (unit: %) defined by the formula: (Relative density=bulk density/theoretical density).

The aluminum nitride sintered body according to the present invention has a large heat radiation amount and excellent heating characteristic. Further, since the sintered body has almost no conspicuous variation in color at the surface and is blackish brown or blackish gray, its commercial value is high. Accordingly, the aluminum nitride sintered body can be used suitably particularly for various heating-apparatuses. Furthermore, since the aluminum nitride sintered body according to the present invention does not use a sintering aid or a blacking agent as a feed source of a metal element besides aluminum and the content of the metal atoms beside aluminum can be suppressed to not more than 100 ppm, it causes no contamination. Therefore, the sintered body is most suitable as a material for high purity processing. In particular, the sintered body will not afford any serious adverse effect upon the semiconductor wafer or its apparatus itself in the semiconductor-producing process.

In the following, more concrete experimental results will be explained.

EXPERIMENT 1

(Experiment A)

Aluminum nitride sintered bodies were actually produced as follows. As a raw material of aluminum nitride, high purity powder produced by the reducing/nitriding process or the directly nitriding process was used. In each powder, the content of each of Si, Fe, Ca, Mg, K, Na, Cr, Mn, Ni, Cu, Zn, W, B and Y was not more than 100 ppm, and no other metal was detected besides those metals and aluminum.

A preliminarily molded body having a discoidal shape was produced by uniaxially press molding each raw material powder. As shown in FIG. 8, the molding 6 was placed in a mold in the state that the molding 6 was sealed inside the carbon foils. Then, the molding was fired at 1900° C. by hot press for 2 hours, while pressure of 200 kg/cm² was applied thereto. Thereby, an aluminum nitride sintered sample in Test Run No. A-1 was produced.

This sample A1 was heated at 1900° C. for 2 hours in an nitrogen atmosphere, thereby producing a sample A2. In this sample A2, an outer peripheral portion was yellowish white, and a gray portion was produced inside the yellowish white portion. With respect to each of Sample A1 and the yellowish white portion and the gray portion of Sample A2, an ESR spectrum was measured. FIGS. 1, 2 and 3 are the ESR spectra of Sample A1 and the gray portion and the yellowish white portion of Sample A2, respectively. The spin amount, g-value, of Sample A1 was 2.0053±0.0001, its peak intensity was high, and the peak was sharp. The spin amount per unit mg of aluminum was $7.9 \times 10^{11}$ spin/mg. The spin amount, g-value, of the gray portion was 2.0018±0.0001, and its peak intensity was small. The spin amount per unit mg of aluminum was $2.1 \times 10^{12}$ spin/mg. The spin amount, g-value, of the yellowish white portion was 1.9978±0.0001, its peak intensity was small, and the profile of the peak was broad. The spin amount per unit mg of aluminum was $1.5 \times 10^{13}$ spin/mg.

Further, the lightness of Sample A1 was N 3.5, that of the yellowish white portion of Sample A2 was N 8, and that of the gray portion of Sample A2 was N 5. Furthermore, with respect to each sample, a main crystalline phase and other crystalline phase were measured by the X-ray diffraction analysis, thereby obtaining the afore-mentioned result.

Figure 7:
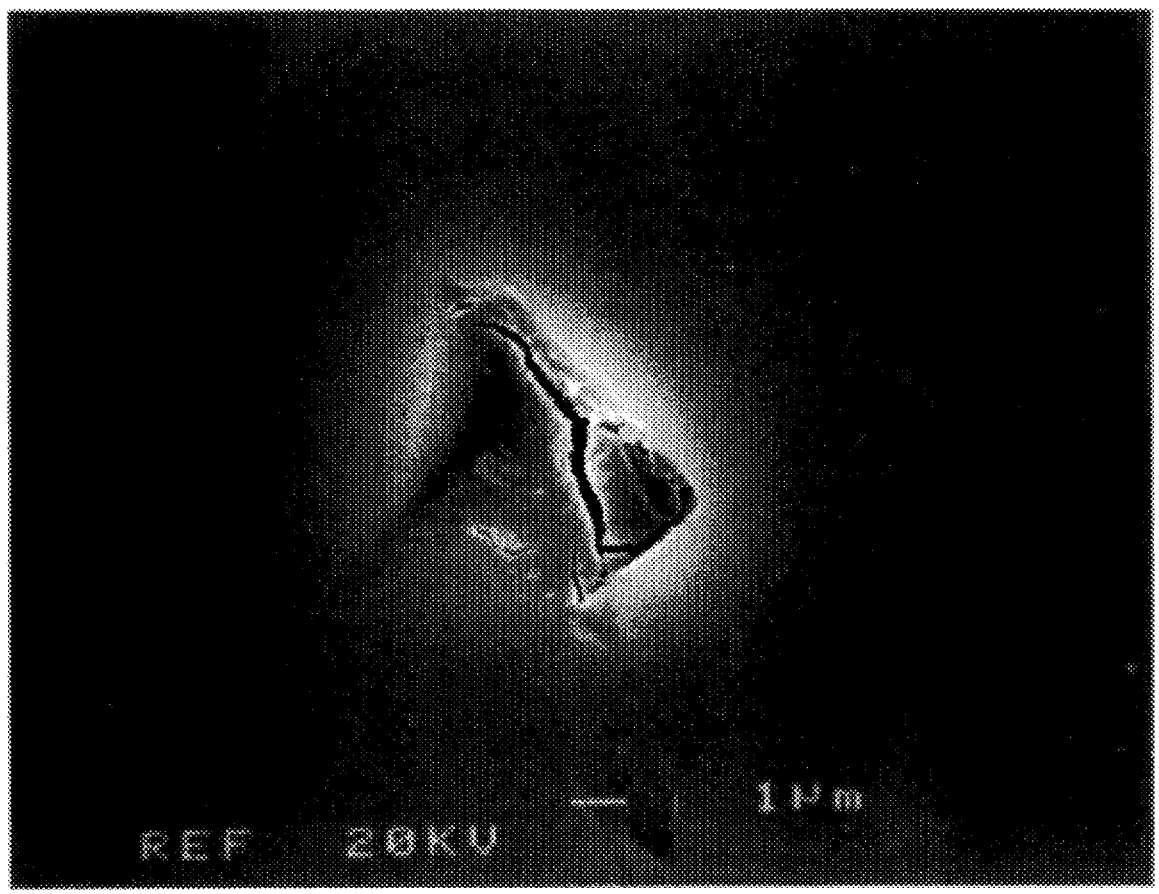
FIG. 7 is an electron microphotograph of a ceramic tissue in the state that a grain of a $(AlN)_x(Al_2OC)_{1-x}$ phase is produced in a matrix composed of particles of the AlN crystalline phase.

Among them, FIG. 5 shows an electron microphotograph of a ceramic tissue of Sample A1, and FIG. 6 shows an electron microphotograph of a ceramic tissue near the grain boundary of the aluminum nitride grain. Further, FIG. 7 shows an electron microphotograph of a ceramic tissue of the gray portion. In this tissue, an X-ray diffraction analysis result and an analysis result of an absorption spectrum of the visible light in a matrix portion were the same as those of Sample A1. However, the $(AlN)_x(Al_2OC)_{1-x}$ phase seen black exists in this matrix, a slight gap exists between the crystalline grain and the AlN crystalline phase, and the light is diffracted in this gap to make it white. The tissue of the matrix of this sintered body is fundamentally the aluminum nitride sintered body according to the present invention which became relatively more black. However, the lightness of the sintered body rises up to N 5 due to the above diffracted lights.

In the same manner as in Experiment B, aluminum nitride sintered bodies in Test Run Nos. B1 to B9 in Tables 1 and 2 were actually produced. As a aluminum nitride raw material, high purity powders produced by the reducing/ nitriding process or the directly nitriding process were used. In each powder, the content of each of Si, Fe, Ca, Mg, K, Na, Cr, Mn, Ni, Cu, Zn, W, B and Y was not more than 100 ppm, and any other metal was detected besides aluminum and those metals.

In each test run, the firing temperature and pressure in the firing step were varied as shown in Tables 1 and 2. The holding time period in the firing step was set at 2 hours. With respect to the aluminum nitride sintered body in each test run, a main crystalline phase and other crystalline phase of the sintered body were measured by the X-ray diffraction analysis. Further, the relative density, the hue, and the lightness of the sintered body was measured. The relative density of the sintered body was calculated from the bulk density/theoretical density, the bulk density being measured by the Archimedean method. The theoretical density of the sintered body is 3.26 g/cc because no sintering aid having a large density was contained. The hue of the sintered body was visually measured, and the lightness of the sintered body was measured by the afore-mentioned method.

TABLE 1

| | Test Run No. | | | | |
|---|---|---|---|---|---|
| | B1 | B2 | B3 | B4 | B5 |
| AlN powder | Nitriding under reduction | Nitriding under reduction | Nitriding under reduction | Nitriding under reduction | Nitriding under reduction |
| Firing temperature (°C.) | 1800 | 1800 | 1700 | 1750 | 1850 |
| Pressure (kg/cm²) | 200 | 150 | 200 | 150 | 100 |
| Main crystalline phase | AlN | AlN | AlN | AlN | AlN |
| Other crystal(s) | AlON | AlON | AlON | AlON | AlON |
| Relative density (%) | 99.4 | 99.4 | 97.8 | 99.0 | 99.0 |
| g-value | 2.0052 | 2.0052 | 1.9971 | 2.0051 | 2.0018 |
| Hue of sintered body | blackish gray | blackish gray | white | blackish gray | gray |
| Lightness of sintered body | N3.5 | N3.5 | N8.0 | N4.0 | N5.0 |

TABLE 2

| | Test Run No. | | | |
|---|---|---|---|---|
| | B6 | B7 | B8 | B9 |
| AlN powder | Nitriding under reduction | Nitriding under reduction | Nitriding under reduction | Direct nitriding |
| Firing temperature (°C.) | 1800 | 1900 | 1950 | 1900 |
| Pressure (kg/cm$^2$) | 250 | 200 | 200 | 300 |
| Main crystalline phase | AlN | AlN | AlN | AlN |
| Other crystal(s) | AlON | AlON | AlON | AlON |
| Relative density (%) | 100 | 99.7 | 99.4 | 99.0 |
| g-value | 2.0059 | 2.0053 | 1.9978 | 2.0012 |
| Hue of sintered body | blackish brown | blackish gray | yellowish white | gray |
| Lightness of sintered body | N2.0 | N3.5 | N8.0 | N5.0 |

As is seen from the above results according to the present invention, the g-value in the ESR spectrum has the conspicuous correlationship between the hue and the lightness of the sintered body. Test Run Nos. B1, B2, B4, B5, B6, B7 and B9 fall within the scope of the present invention, whereas Test Run Nos. B3 and B8 fall outside the scope of the invention.

Wafer-Heating Test

A plate having a diameter of 210 mm and a thickness of 10 mm was prepared from the aluminum nitride sintered body of Sample A1 according to the present invention, and was placed in a vacuum chamber equipped with a heating mechanism having an infrared lamp unit. A silicon wafer having a diameter of 8 inches was placed on this plate, and thermocouples were fitted to the plate and the silicon wafer to simultaneously measure each of the temperatures thereof. As the infrared lamp unit, twenty of 500 W infrared lamps having an infrared peak around a wavelength of 1 μm and fitted to an reflecting plate made of aluminum were used, and these infrared lamps and the reflecting plate were arranged outside the vacuum chamber.

The infrared beam radiated from each infrared lamp was, directly or indirectly after being reflected from the reflecting plate, led to the aluminum nitride sintered plate through a circular quartz window (diameter: 250 mm, thickness: 5 mm) provided at the vacuum chamber to heat the plate.

In this heating apparatus, each infrared lamp was light to elevate the temperature of the plate from room temperature to 700° C. in one minute, and the plate was kept at 700° C. for one hour. Thereafter, the infrared lamps were put out, and the plate was gradually cooled. Consequently, the consumption power of the infrared lamps was 8700 W at the maximum, and the temperature could be stably controlled. Further, measurement of the temperature of the silicon wafer revealed that when the temperature of the plate was kept at 700° C., the temperature of the silicon wafer was 609° C.

Heating Experiment in Comparative Example

Next, an aluminum nitride powder obtained by the reducing/nitriding process and containing 200 ppm of carbon was used, and a discoidal molding was produced by pressing this powder under pressure of 3 tons/cm$^2$ by the cold isostatic press. This molding was fired at 1950° C. for 2 hours to produce a white aluminum nitride sintered body having a density of 99.4%. By using this sintered body, a silicon wafer-heating experiment was effected in the same manner as mentioned above.

As a result, the consumption power was 10 kw at the maximum, and the time period required to realizing the temperature elevation was longer by around 2 minutes. Further, the infrared lamps were more likely wire-cut upon reception of a heat cycle of temperature rising-temperature descending between room temperature and 700° C.

Furthermore, measurement of the temperature of the silicon wafer revealed that when the plate was held at 700° C., the temperature of the silicon wafer was 593° C. Thus, it was clarified that as compared with the invention example, the temperature of the silicon wafer was lower.

Electrode and Resistive Heat Generator Burying Experiment

As in the same with Sample A1 of the present invention, the above-mentioned aluminum nitride powder was used, and a coil (resistive heat generating wire) made of a 0.5 mm-diameter molybdenum wire was buried in the powder, while a circular electrode, 5 mm in diameter and 10 mm in thickness, made of molybdenum was connected to the coil and also buried. The resulting powder body in which the coil and the electrode were buried was uniaxially press molded to obtain a discoidal molding. At that time, the coil buried in the molding took a swirling planar shape.

As shown in FIG. 8, the discoidal molding was set inside the mold in the above-mentioned manner, and held at 1800° C. under pressure of 200 kg/cm$^2$ for 2 hours according to the hot press. Thereby, an aluminum nitride sintered body was obtained, in which the above resistive heat generator and the molybdenum electrode were buried. This molybdenum electrode can be used as an electrostatic chucking electrode or a high frequency electrode.

In the following, the second aspect of the present invention will be explained.

During the course of investigating aluminum nitride sintered bodies, the present inventors have succeeded in producing a blackish gray to blackish brown aluminum nitride sintered body containing almost no metallic element such as a sintering aid or a blacking agent other than aluminum and having a extremely low lightness with a black of not more than lightness N4 specified in JIS Z 8721.

Since this aluminum nitride sintered body exhibits the black having not more than the lightness N 4 specified in JIS Z 8721, the sintered body has a large radiation heat amount and an excellent heating characteristic. Therefore, such a sintered body is suitable as a substrate constituting a heating material for a ceramic heater, susceptor, etc. In addition, since the content of the metal element(s) other than aluminum can be made extremely small, it is not feared that a semiconductor wafer is contaminated with such a metallic element. In particular, it is not feared that the sintered body will afford an adverse effect upon the semiconductor wafer or an apparatus therefor. Furthermore, a variation in color at the surface of the aluminum nitride sintered body according to the present invention is not conspicuous, and appearance of the aluminum nitride sintered body is extremely excellent. In addition, since the sintered body has a high black degree, its commercial value is largely enhanced.

The present inventors investigated the reason why the aluminum nitride sintered body produced as mentioned later had a high black degree and low lightness. As a result, the present inventors discovered that if the aluminum nitride sintered body satisfies a specific requirement, its black degree of the sintered body is progressed. The present invention was accomplished based on the above knowledge.

First, the X-ray diffraction analysis of the blackish brown or blackish gray aluminum nitride sintered body having not more than a lightness N4 revealed that its main crystalline phase was AlN and AlON was produced as auxiliary crystalline phase.

On the other hand, when an aluminum nitride powder having a purity of not less than 99.9 wt % was sintered at 1950° C., a yellowish white sample was obtained. The analysis of the crystalline tissue of this sample revealed that a so-called 27R phase ($Al_2O_3$—7AlN) phase was produced besides the main AlN crystalline phase. The grain diameter of the AlN crystalline phase was about 2 μm to about 4 μm, and the 27R phase ($Al_2O_3$—7AlN phase) was precipitated in the grain boundary. According to a known $Al_2O_3$—AlN state diagram, the crystalline phase produced in the sintering changes at a boundary of 1920° C. In view of this, it is considered that the above difference in the crystalline phase depends upon the difference in the sintering temperature.

When the above sample having the low lightness of not more than N 4 was heated at 1900° C. in a nitrogen atmosphere, a yellowish white portion was produced. In this yellowish white portion, almost no 27R phase existed besides the AlN main crystal, and a spherical AlON crystalline phase mainly existed. The crystalline phase of the low lightness sample having undergone the thermal treatment differs from that of the yellowish white sample.

Further, no difference was observed in the lattice constant of AlN for every hue of the aluminum nitride sintered bodies. That is, no particular correlation was seen between the kinds of the crystalline phases besides the AlN crystalline phase and the hue or the lightness. Therefore, it is considered that the change in the hue of the aluminum nitride sintered body is based not on the kind of the crystalline phase but on a defect structure inside the AlN crystalline phase or the defect structure of the grain boundary.

In order to make clear the mechanism what physical property of each of the above samples exhibits the black color and to make clear the reason whey the high purity aluminum nitride sintered sample obtained as mentioned later exhibits the black color, various spectra mentioned below were measured and examined.

Diffraction and Reflection Spectra in the Visible and Infrared Light

Figure 10A:
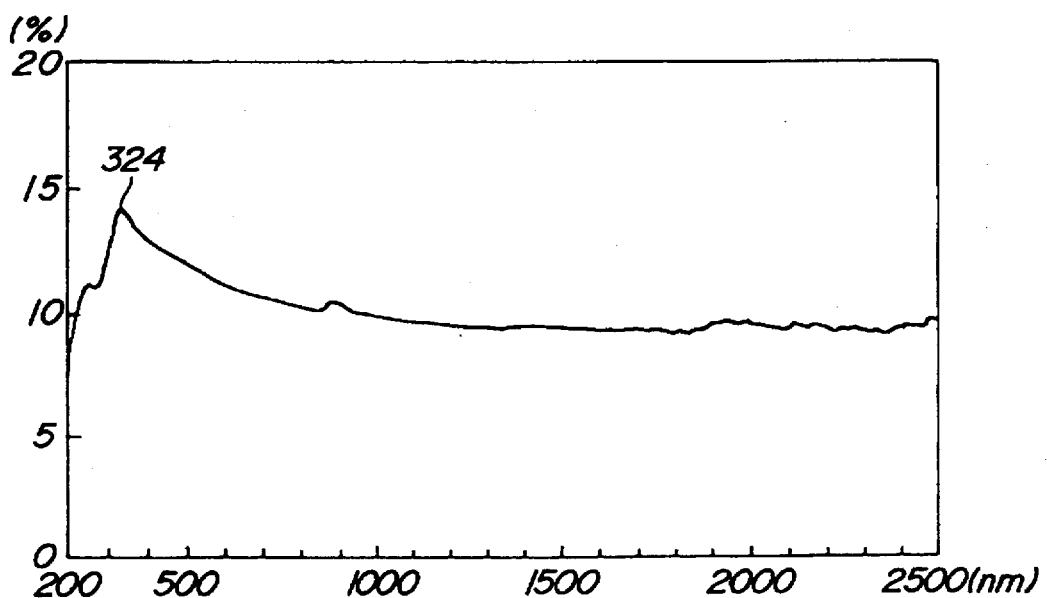
FIG. 10(a) is a diffusion-reflection spectrum in a visual light-infrared light zone of an aluminum nitride sintered sample having a low lightness.
Figure 10B:
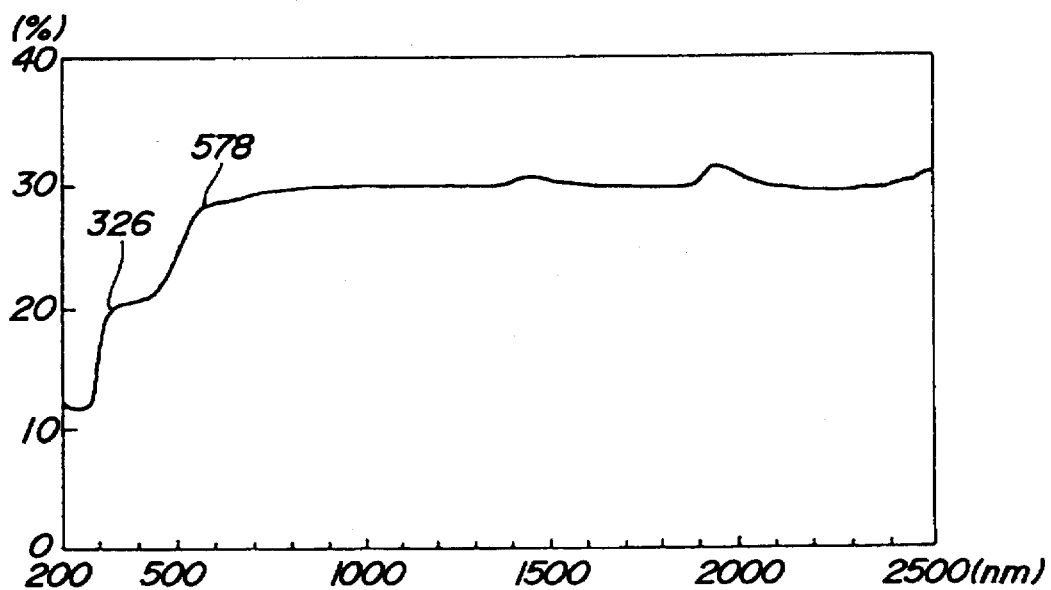
FIG. 10(b) is a diffusion-reflection spectrum in a visual light-infrared light zone of a yellowish white portion of an aluminum nitride sintered sample having a low lightness obtained by thermal treatment at 1900° C.

FIG. 10(a) is a graph showing a diffraction/reflection spectrum of a visible and infrared light of an aluminum nitride sintered sample having a low lightness, and FIG. 10(b) a graph showing a diffraction/reflection spectrum of the visible and infrared light of a yellowish white portion of this sample produced by heating at 1900° C. Since the light transmittance of the sample is low, an adsorbing characteristic of the visible and infrared light of the sample was evaluated by the diffraction/reflecting method. In the diffraction/reflection method, it is judged that an absorbing band exists near a wavelength at which the reflecting intensity lowers.

In the sample having the low lightness, there was a continuous band over the infrared light and the visible light. In particular, since the continuous absorption occurs in the visible light, the sample became black. In the yellowish white portion, there were absorbing bands in short wavelength ranges of 300 nm to 500 nm and 200 nm to 300 nm. As mentioned above, the yellow color is exhibited through the absorption of the light on the short wavelength side. These visible and infrared absorption spectra are in coincidence with data on the hue and the lightness of each sample. Particularly, in the case of the sample having the low lightness, since the continuous absorption occurs over the wide wavelength range of the infrared and visible light, it is considered that a number of bands are formed in a band gap. This is considered to be a transitional state before the crystalline phase having much lattice defects is not still stabilized.

Figure 11A:
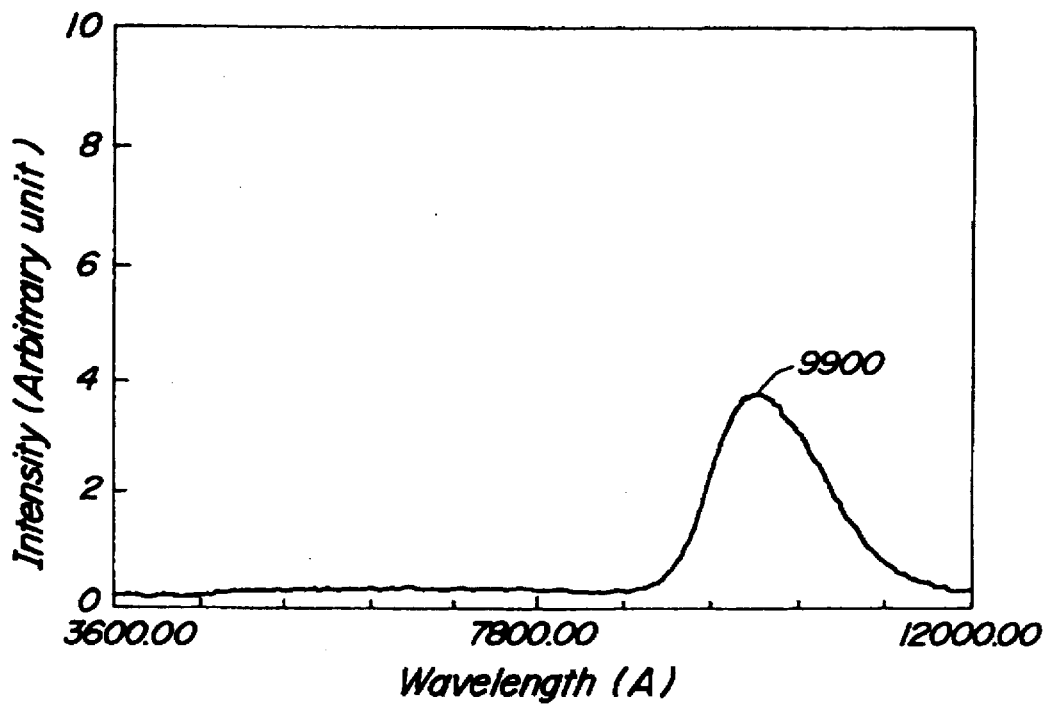
FIG. 11(a) is a spectrum of a photoluminesence of an aluminum nitride sintered sample having a low lightness.
Figure 11B:
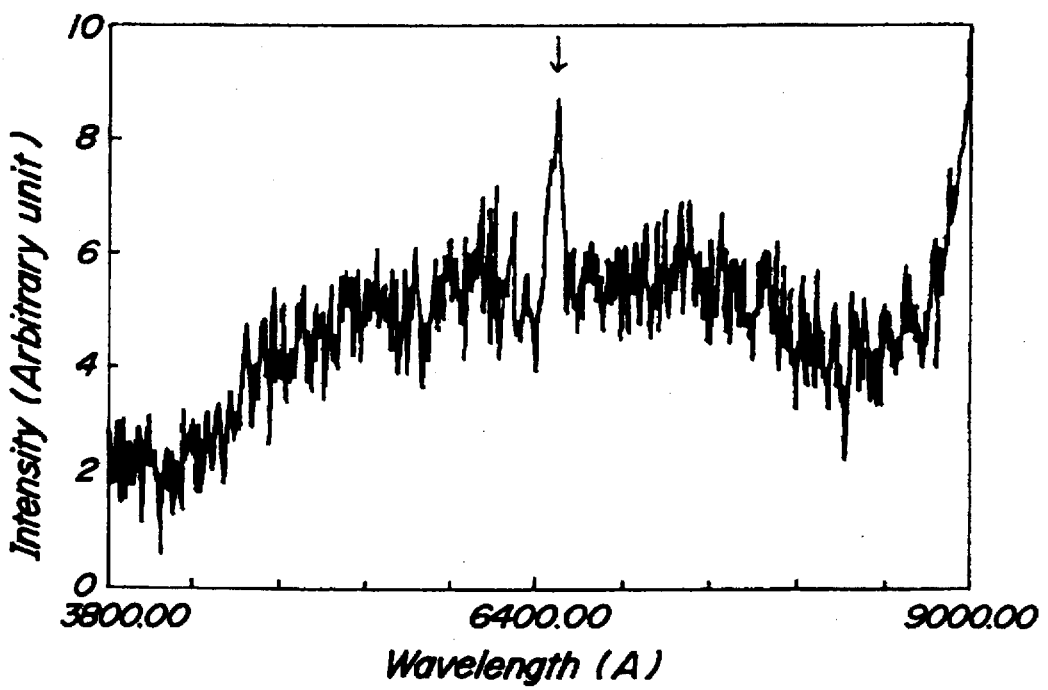
FIG. 11(b) being spectrum in FIG. 11(a) with a visual light zone being enlarged.

In order to evaluate the band structure of the aluminum nitride sintered body, a spectrum of a photoluminesence was measured. FIG. 11(a) is a graph showing the photoluminescence of a sample having a low lightness. FIG. 11(b) is a graph showing a visible light range of the spectrum of FIG. 11(a) in an enlarged scale. FIG. 12 is a spectrum of a photoluminescence of a yellowish white portion of this sample obtained by thermal treatment.

In the yellowish white portion, there was a light emission at 990 nm in an infrared range, and broad peaks each having a large width of the light emission at 698 nm, 530 nm and 486 nm in the visible light range, respectively. In the sample having the low lightness, a large peak was detected at 990 nm as in the case with the yellowish white portion. In the visible light range, no collective large light emission was observed in the visible light range, and light emissions were observed over the entire visible light range. The reason why the intensity of the light emissions is weak is that since the sample itself has a low lightness, some of them is absorbed inside the sample. As mentioned above, the sample is characterized in that the light emissions are detected over a wide visible light range. This means that a numerous kinds of band gaps are formed to emit lights over a wide wavelength range. In FIGS. 11(b) and 12, the peaks shown by downward arrows noises of a spectroscope when a measurement wavelength was changed from 540 nm to 570 nm.

Raman Spectrum

In order to know the construction of the above defect structure by which the visible light is absorbed over a wide wavelength range, a Raman spectrum was measured with respect to each of samples mentioned later. When a light having a frequency $f_0$ is irradiated upon a material, a light having a frequency $f_0 \pm f_1$ is observed among a scattered light in some cases. Such a variation in frequency occurs through exchange of an energy between photon entering the material and the material. Therefore, information on the lattice vibration and the electron levels can be obtained by measuring the change in frequency $f_1$. The $f_1$ in a range of about 4000 to 1 $cm^{-1}$ is called Raman scattering.

FIGS. 13 to 17 shows Raman spectra obtained by measuring samples of various kinds of aluminum nitride sintered bodies. The lattice vibration mode of the AlN crystal can be specifically evaluated by these Raman spectrum. Based on this evaluation, information on defects inside the AlN crystal, the concentration of oxygen solid-solved, and the band structure in band gaps can be obtained.

The Al atoms and the N atoms in the AlN crystalline phase take an 4-coordinate wurtzite structure in which the aluminum atom and the three N atoms form a $sp^3$ hybrid orbit. As symmetrical species, c-axis symmetrical $A_1$ species, a-axis symmetrical $E_1$ species and $E_2$ species exist. Their six optically active vibrations appear in the Raman spectrum. These peaks are identified as shown in Table 3. In Table 3 are shown the symmetrical spices and Raman shift values ($cm^{-1}$) of the peaks in the Raman spectrum.

TABLE 3

| $A_1$ (TO) | $A_1$ (LO) | $E_1$ (TO |
|---|---|---|
| 632 | 910 | 692 |
| $E_1$ (LO) | $E_2$ | $E_2$ |
| 936 | 678 | 271 |

These peaks can be observed in every sample. Since no difference observed in the half-value width of the peak with respect to each sample, it is presumed that the content of oxygen solid-solved in the AlN crystal does not definite differ. Peak in a range of 133 to 100 $cm^{-1}$, particularly, a peak at 133 cm$^{-1}$ is a peak showing that a number of electron levels are present in the band gap of AlN. It is seen that in yellowish white samples (FIGS. 13 and 17), peaks in this range, particularly a peak at 133 cm$^{-1}$ is small, whereas in a black sample, a peak at 133 cm$^{-1}$ appears more greatly and more intensively than a peak at a standard vibration.

As mentioned above, the peaks appearing in the Raman spectrum in 80 to 150 cm$^{-1}$, particularly the peak at 133 nm corresponds to a specific electron level existing in the band gap of AlN. A value [I(133)/I(680)] normalized by dividing the intensity of this peak by that of a peak in a range of 650 to 680 cm$^{-1}$ caused at the standard frequency of the AlN crystal is a physical characteristic value significant in expressing this band structure. Although the Raman shift value of this peak may slightly deviate from 133 cm$^{-1}$ depending upon experimental condition, etc., such a deviation is acceptable if it is within a significant range.

It was specifically confirmed that if the above normalized value is set not less than 0.3, the lightness of the aluminum nitride sintered body can be made not more than N 5.0. Further, it was clarified that aluminum nitride sintered bodies having the lightness N 4.0 or less can be provided by setting this value at not less than 0.4, whereas aluminum nitride sintered bodies having the lightness N 3.0 or less can be provided by setting this value at not less than 1.0.

It is considered that in the yellowish white samples and the yellowish white portions of the black samples produced by thermally treating it under nitrogen atmosphere, oxygen is solid-solved in the AlN crystal, that is, a N$^{+3}$ site in the AlN crystal is substituted by O$^{-2}$, and Al$^{+3}$ is lost. It is presumed that a color center is formed by an unpaired electron trapped by this lattice defect, and conspicuously absorbs a light on a short wavelength side of the visible light to exhibit a yellowish white color. Further, it is presumed that a color center is formed by substituting N$^{+3}$ by two oxygen ions.

Figure 18:
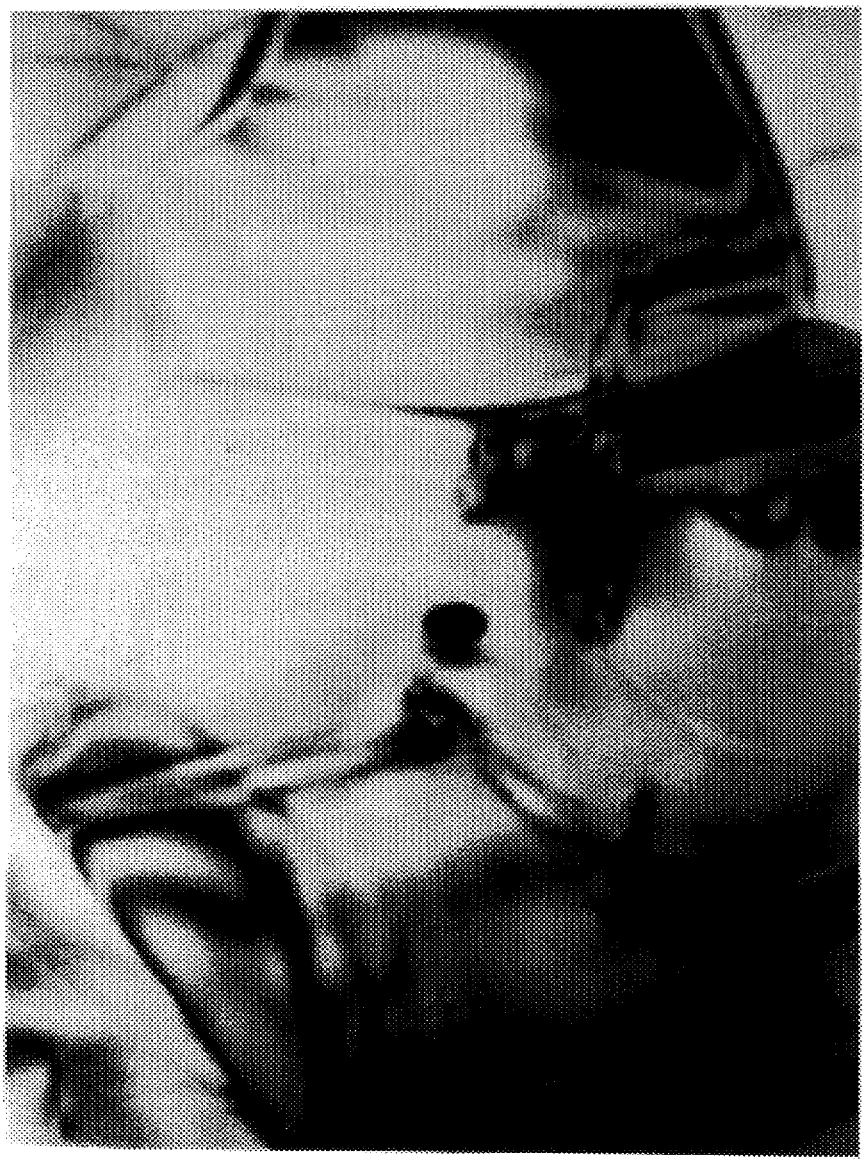
FIG. 18 is an electron microphotograph showing a ceramic tissue of an aluminum nitride sintered sample having a low lightness within the scope of the second aspect of the present invention.
Figure 19:
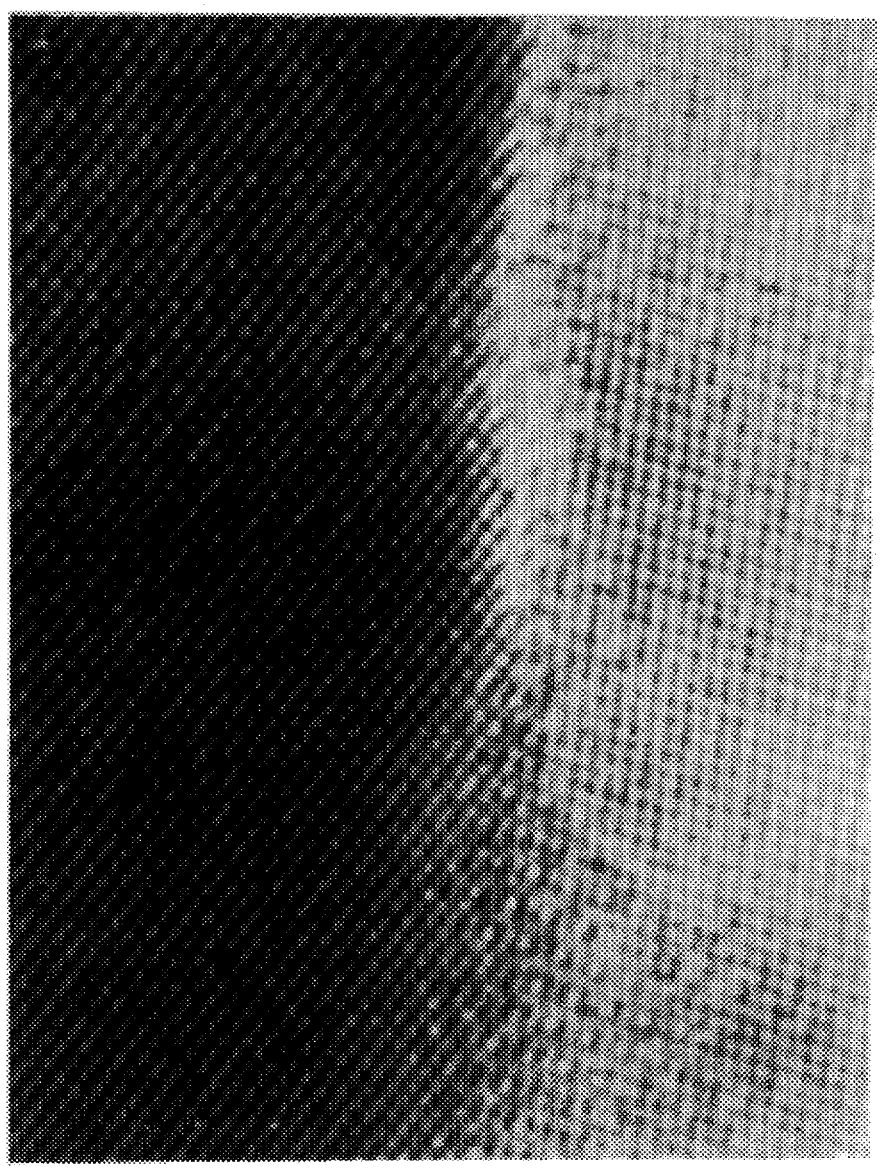
FIG. 19 is an electron microphotograph showing a ceramic tissue near an aluminum nitride grain of a ceramic tissue of an aluminum nitride sintered sample having a low lightness within the scope of the second aspect of the present invention.

The microstructure of the above-mentioned black aluminum nitride is shown in FIG. 18. As shown in FIG. 18, very small AlON crystals exist in the AlN crystal grain, a grain boundary portion at which the crystals contact is dense and has no gap, free from a crystalline grain boundary. FIG. 19 is an electron microphotograph of the black aluminum nitride sintered sample in which the grain boundary portion of the AlN crystals. No foreign phase is seen at the AlN crystalline phase.

The aluminum nitride sintered body having the above-mentioned Raman spectrum characteristic and the small lightness could be produced by the following process. First, for powdery aluminum nitride as a raw material, a powder obtained by reducing/nitriding method is preferably used. Addition of any metal element other than aluminum to the raw material of the aluminum nitride powder should be avoided, and such a metal element should be not more than 100 ppm. The "metal element other than aluminum" means metal elements belonging to Groups Ia–VIIa, VIII, Ib, and IIb and part of Groups IIIb and IVb (Si, Ga, Ge, etc.) in the Periodic Table.

The high purity aluminum nitride powder having a small content of the above metal(s) is prepared by the reducing/nitriding process, and is molded by a uniaxial press molding or cold isostatic press to produce a molding. The molding is fired in a reducing atmosphere without being contacted with surrounding air. As a firing method, hot press or hot isostatic press may be adopted.

The firing pressure is set at not less than 300 kg/cm$^2$. Judging from an actual producing apparatus, this pressure is preferably set at not more than 0.5 ton/cm$^2$. At that time, the holding temperature in the firing is preferably set at 1750° C. to 1850° C.

The present inventors have repeated investigations on the above process in more detail. As the process for the production of aluminum nitride powder, the reducing/nitriding process and a directly nitriding process are known. Chemical reactions used in these processes are given below.

Reducing/nitriding process:

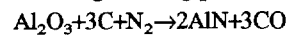

$Al_2O_3+3C+N_2 \rightarrow 2AlN+3CO$

Direct nitriding process:

i) 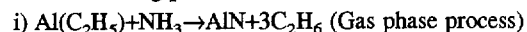 $Al(C_2H_5)+NH_3 \rightarrow AlN+3C_2H_6$ (Gas phase process)

ii) 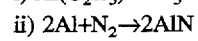 $2Al+N_2 \rightarrow 2AlN$

In the reducing/nitriding process, the aluminum nitride crystal is produced by reducing and nitriding a $-Al_2O_3$ phase with carbon. It is considered that the carbon used as a reducing catalyst remains on the surface of the aluminum nitride crystal, and oxygen not removed by reducing or nitriding remains inside the aluminum nitride sintered body. Aluminum nitride is thermodynamically unstable in air, and the content of oxygen particularly in a fine sintering powder having a surface activity increases because it easily reacts with moisture and oxygen in air even at room temperature. Therefore, the aluminum nitride crystal having activity for moisture and oxygen is stabilized by covering the oxidizable surface layer with an oxide or a hydroxide. This oxidizing treatment is utilized to remove carbon atoms remaining at the surfaces of the reduced grains to enhance the purity.

Therefore, what are important from the standpoint of the quality of the aluminum nitride crystal are the oxidized film present at the surface of the grain and the content of oxygen solid-solved in the aluminum nitride during the reducing/nitriding step.

As mentioned above, the powder obtained by the reducing/nitriding process is molded, and the molding is heated in the reducing atmosphere under application of a high pressure mentioned above. During the heating, CO gas is generated near the surface of the aluminum nitride grains through a reaction between $Al_2O_3$ and C (carbon).

It is considered that numerous electron levels are formed in the AlN band gap by the gas phase species ($Al_2O_2$, $Al_2O$, Al) and oxygen pores, so that a specific band structure is formed to continuously absorb the visible light over a wide wavelength range. At that time, the following reactions may occur at the surface of the AlN powder.

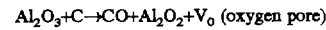

$Al_2O_3+C \rightarrow CO+Al_2O_2+V_O$ (oxygen pore)

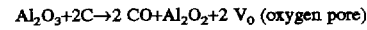

$Al_2O_3+2C \rightarrow 2\ CO+Al_2O_2+2\ V_O$ (oxygen pore)

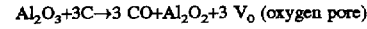

$Al_2O_3+3C \rightarrow 3\ CO+Al_2O_2+3\ V_O$ (oxygen pore)

In the above, the relative density of the aluminum nitride sintered body is a value defined by the formula (Relative Density=bulky density/theoretical density), and its unit is %.

The aluminum nitride sintered body according to the present invention has a large heat radiation amount and excellent heating characteristic. Further, since the sintered body has almost no conspicuous variation in color at the surface and is blackish brown or blackish gray, its commercial value is high. Accordingly, the aluminum nitride sintered body can be used suitably particularly for various heating apparatuses. Furthermore, since the aluminum nitride sintered body according to the present invention does not use a sintering aid or a blacking agent as a feed source of a metal element besides aluminum and the content of the metal atoms beside aluminum can be suppressed to not more than 100 ppm, it causes no contamination. Therefore, the sintered body is most suitable as a material for high purity processing. In particular, the sintered body will not afford any serious adverse effect upon the semiconductor wafer or its apparatus itself in the semiconductor-producing process.

In the following, more specific experimental results will be explained.

Experiment A

Aluminum nitride sintered bodies were actually produced as follows. As a raw material of aluminum nitride, high purity powder produced by the reducing/nitriding process was used. In each powder, the content of each of Si, Fe, Ca, Mg, K, Na, Cr, Mn, Ni, Cu, Zn, W, B and Y was not more than 100 ppm, and no other metal was detected besides those metals and aluminum.

A molding having a discoidal shape was produced by uniaxially press molding each raw material powder. A sintered body was produce by setting the molding in a mold, and holding it at a given firing temperature in nitrogen atmosphere under a given pressure for a given time period. These values are shown in Table 4. The main crystalline phase and other crystalline phase of each sample were measured by the X-ray diffraction analysis. Further, I(133) /I(680), the relative density, the hue and the lightness of the sintered body were measured.

The relative density of the sintered body was calculated from bulk density/theoretical density, and the bulk density was measured by the Archimedean method. Since no sintering aid having a large density was not contained, the theoretical density of the sintered body is 3.26 g/cc. The hue of the sintered body was visually determined, and the lightness of the sintered body was measured according to the above-mentioned process. These results are also shown in Table 4. Test Runs A1 and A5 fall outside the scope of the present invention, and Test Runs A2, A3, A4 and A4 fall in the scope of the present invention.

Raman spectra were measured under the condition that the wavelength of a laser was 514.5 nm, three monochrometers were used, an incident slit was 1200 μm in width, and sensitivity was 0.05 (nA/FS)×100.

Experiment B

The sample in Test Run A2 of Experiment A was thermally treated at 1900° C. in nitrogen atmosphere for 2 hours, thereby producing Sample B. An outer peripheral portion of Sample B was changed to yellowish white (lightness N 8). This portion was cut out, and its Raman spectrum was measured. A result was I(133)/I(680) was 0.10.

Infrared Spectrum

A visible and infrared reflection spectrum and a visible and infrared reflection spectrum of Sample No. B were similar to those in FIGS. 10(a) and 10(b), respectively. Explanation of these figures has been made before, and is omitted here.

FIG. 11(a) is a spectrum in a photoluminescence of Test Run A2. FIG. 11(b) is a graph showing an enlarged spectrum of FIG. 11(a) in a visible light range. FIG. 12 shows a spectrum in the photoluminescence of Test Run B. Explanation of these figures has been made before, and is omitted here.

Wafer-Heating Test

A plate having a diameter of 210 mm and a thickness of 10 mm was prepared from the aluminum nitride sintered body of Sample A2 according to the present invention, and was placed in a vacuum chamber equipped with a heating mechanism having an infrared lamp unit. A silicon wafer having a diameter of 8 inches was placed on this plate, and thermocouples were fitted to the plate and the silicon wafer to simultaneously measure each of the temperatures thereof. As the infrared lamp unit, twenty of 500 W infrared lamps having an infrared peak around a wavelength of 1 μm and fitted to an reflecting plate made of aluminum were used, and these infrared lamps and the reflecting plate were arranged outside the vacuum chamber.

The infrared beam radiated from each infrared lamp was., directly or indirectly after being reflected from the reflecting plate, led to the aluminum nitride sintered plate through a circular quartz window (diameter: 250 mm, thickness: 5 mm) provided at the vacuum chamber to heat the plate.

TABLE 4

Figure 13:
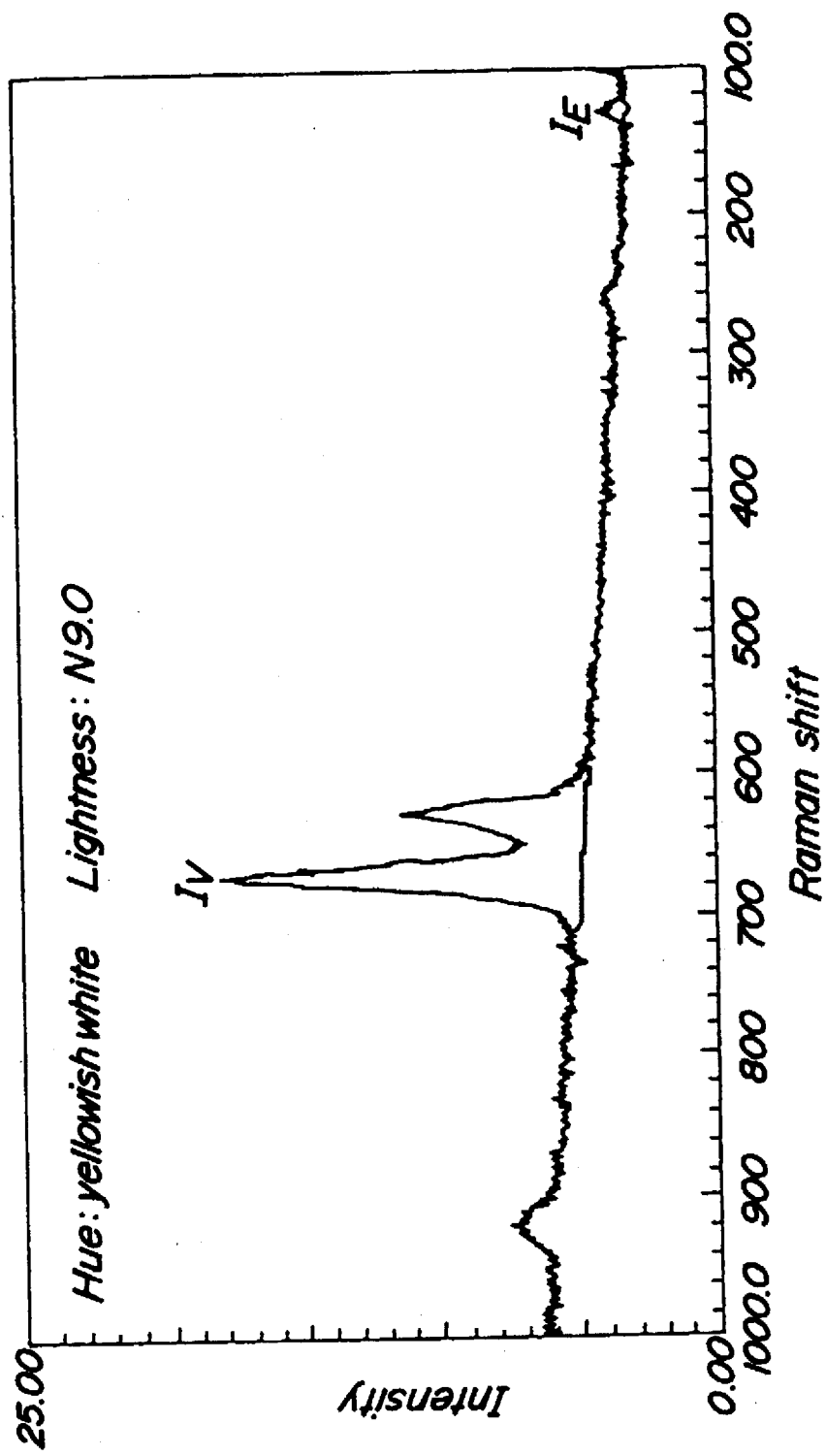
FIG. 13 is a Raman spectrum of a yellowish white sample.
Figure 14:
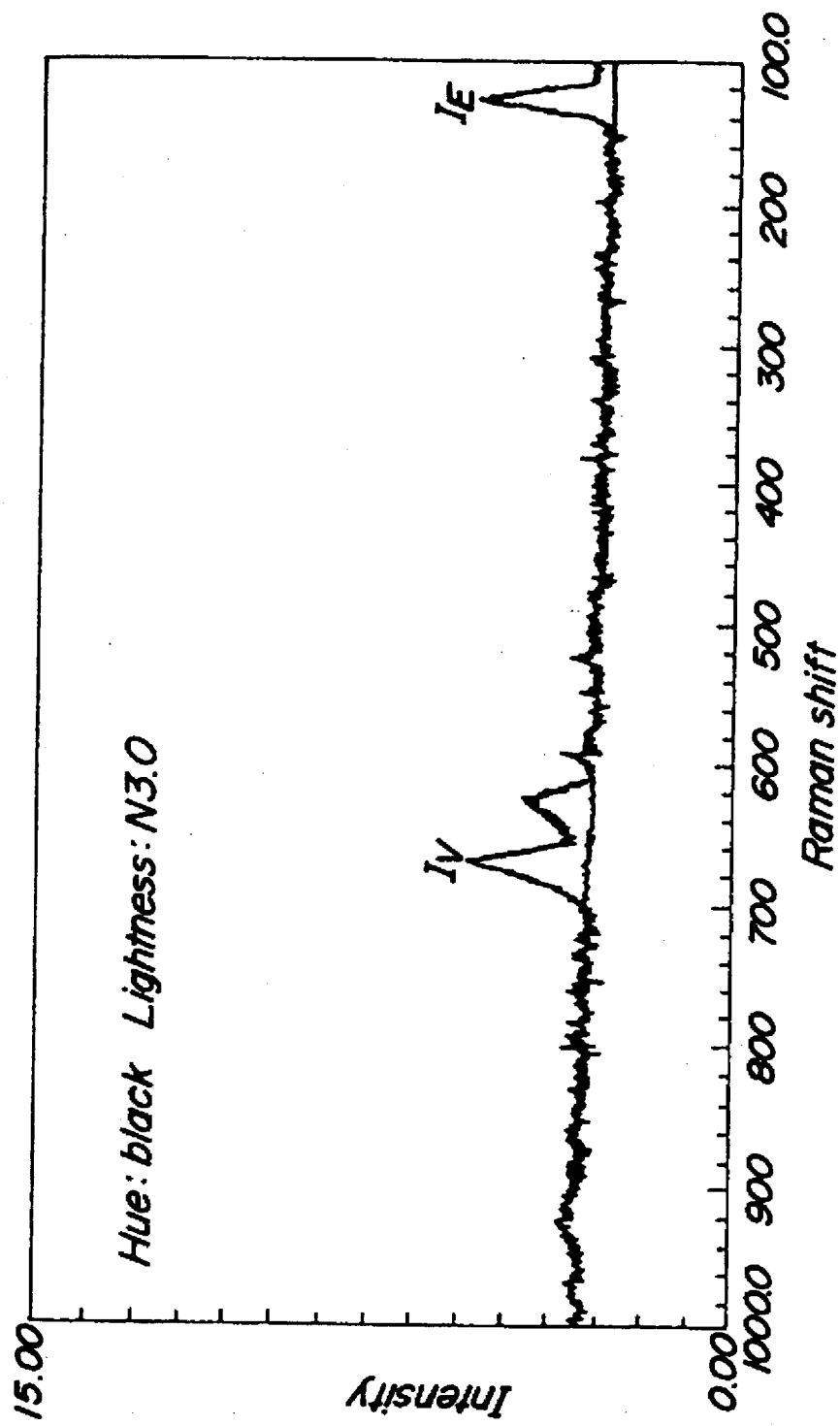
FIG. 14 is a Raman spectrum of a black sample.
Figure 15:
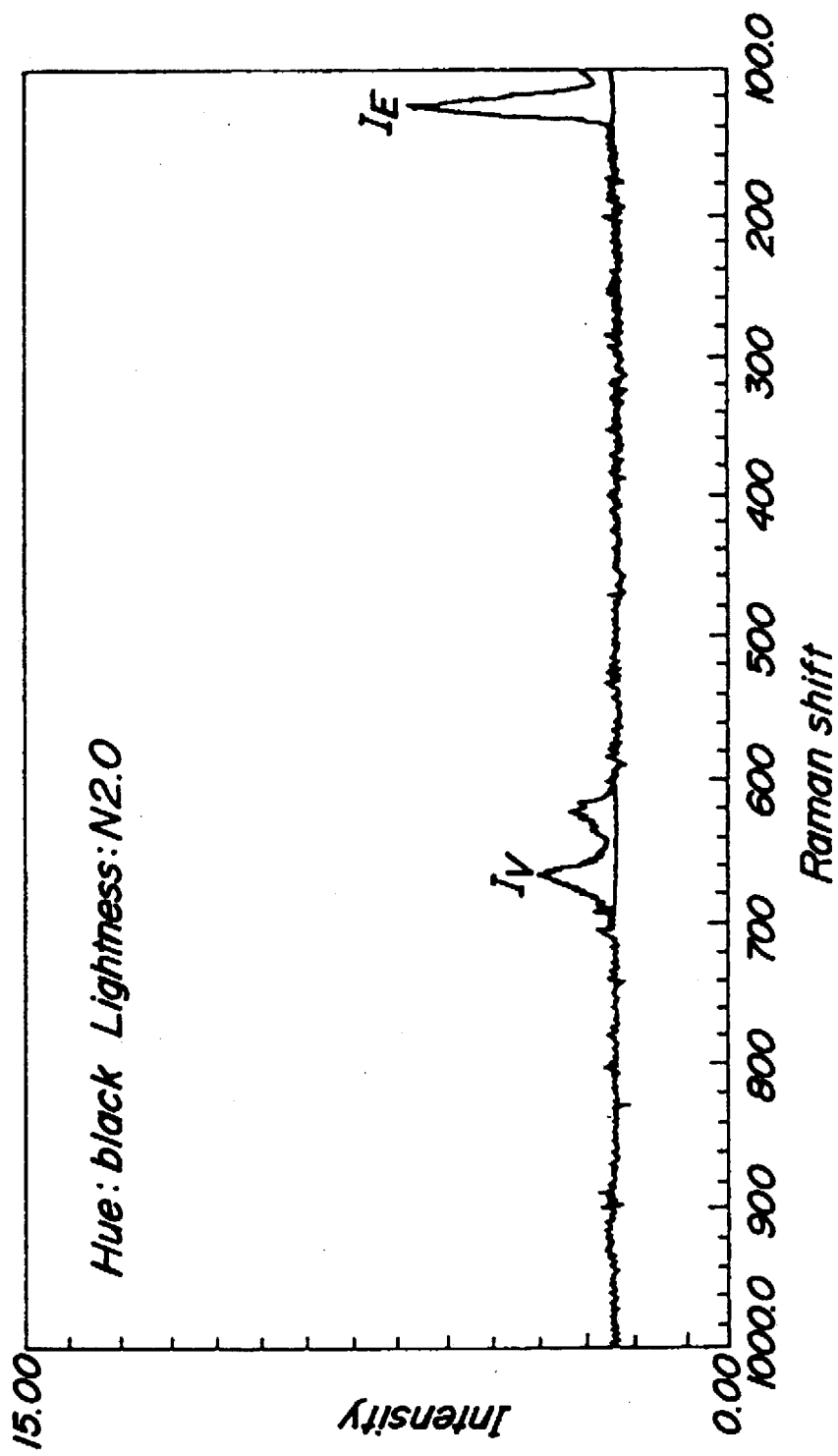
FIG. 15 is a Raman spectrum of another black sample.
Figure 16:
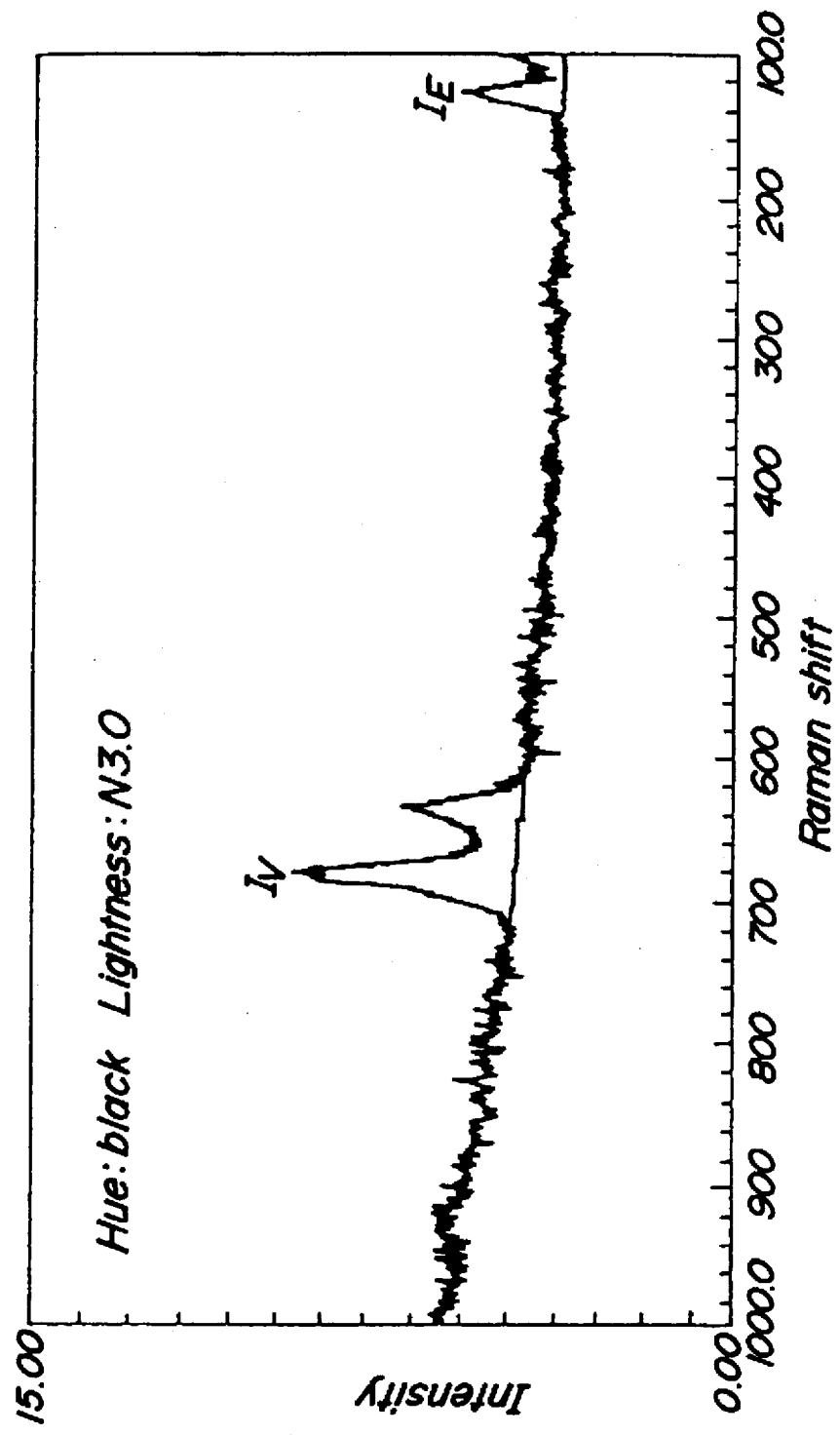
FIG. 16 is a Raman spectrum of a further black sample.
Figure 17:
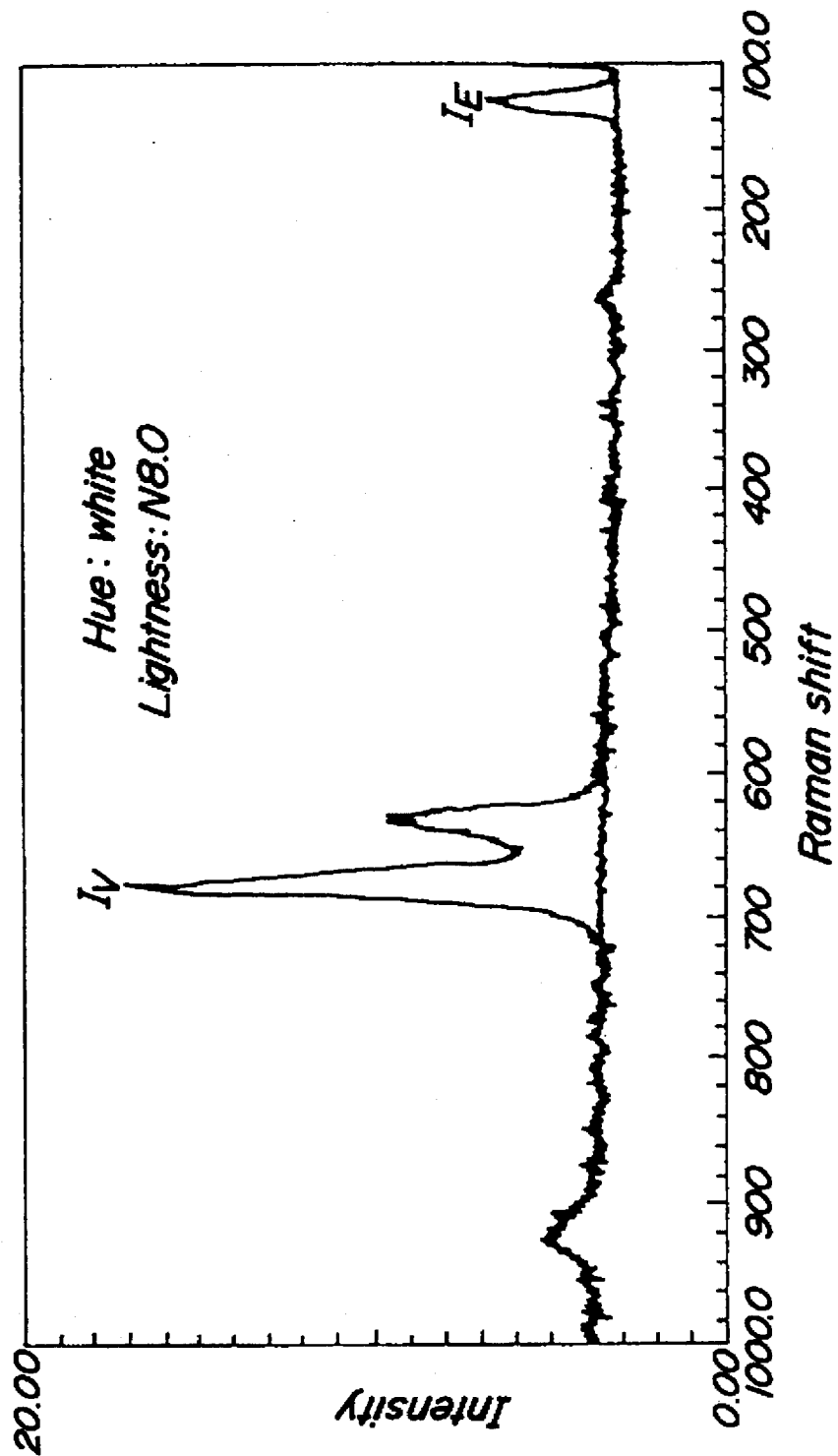
FIG. 17 is a Raman spectrum of a white sample.

| | Test Run No. | | | | | |
|---|---|---|---|---|---|---|
| | A1 | A2 | A3 | A4 | A5 | A6 |
| AlN powder | Nitriding under reduction | Nitriding under reduction | Nitriding under reduction | Nitriding under reduction | Nitriding under reduction | Nitriding under reduction |
| Firing temperature (°C.) | 1950 | 1770 | 1800 | 1850 | 1920 | 1900 |
| Pressure (kg/cm$^2$) | 200 | 300 | 300 | 300 | 200 | 350 |
| Holding time (hr.) | 2 | 2 | 1 | 3 | 2 | 4 |
| Main crystalline phase | AlN | AlN | AlN | AlN | AlN | AlN |
| Other crystal(s) | AlON | AlON | AlON | AlON | AlON | AlON |
| I(133)/I(680) | 0.07 | 1.1 | 2.8 | 0.45 | 0.28 | 0.31 |
| Relative density (g/cc) | 99.4 | 100 | 100 | 100 | 99.7 | 99.5 |
| Hue of sintered body | yellowish white | black | black | black | white | gray |
| Lightness of sintered body | N9.0 | N3.0 | N2.0 | N3.0 | N8.0 | N5.0 |
| Raman spectrum | FIG. 13 | FIG. 14 | FIG. 15 | FIG. 16 | FIG. 17 | — |

It is confirmed from Table 4 that a ratio: I(133)/I(680) between the height I(133) of a peak at 133 cm$^{-1}$ and the height (680) of a peak at 680 cm$^{-1}$ has a clear correlation between the lightness and the hue of the sintered body. The ceramic tissue of the sample in Test Run 2 was similar to that shown in FIG. 18. An electron microphotograph showing the ceramic tissue near the grain boundary of this aluminum nitride grain was similar to that shown in FIG. 19. It was confirmed that the samples in Test Runs A3 and A4 had substantially the same microstructure as shown in these microphotographs.

In this heating apparatus, each infrared lamp was lit to elevate the temperature of the plate from room temperature to 700° C. in one minute, and the plate was kept at 700° C. for one hour. Thereafter, the infrared lamps were put out, and the plate was gradually cooled. Consequently, the consumption power of the infrared lamps was 8550 W at the maximum, and the temperature could be stably controlled. Further, measurement of the temperature of the silicon wafer revealed that when the temperature of the plate was kept at 700° C., the temperature of the wafer was 615° C.

Heating Experiment in Comparative Example

Next, an aluminum nitride powder obtained by the reducing/nitriding process and containing 300 ppm of carbon was used, and a discoidal molding was produced by pressing this powder under pressure of 3 tons/cm$^2$ by the cold isostatic press. This molding was fired at 1940° C. for 2 hours to produce a white aluminum nitride sintered body having a density of 99.4%. By using this sintered body, a silicon wafer-heating experiment was effected in the same manner as mentioned above.

As a result, the consumption power was 10 kw at the maximum, and the time period required to realizing the temperature elevation was longer by around 2 minutes. Further, the infrared lamps were more likely to be wire-cut upon reception of a heat cycle of temperature rising-temperature descending between room temperature and 700° C. Furthermore, measurement of the temperature of the silicon wafer revealed that when the plate was held at 700° C., the temperature of the silicon wafer was 593° C. Thus, it was clarified that as compared with the invention example, the temperature of the silicon wafer was lower.

Electrode and Resistive Heat Generator Burying Experiment

As in the same with Sample A2 of the present invention, the above-mentioned aluminum nitride powder was used, and a coil (a resistive heat generating wire) made of a 0.5 mm-diameter molybdenum wire was buried in the powder, while a circular electrode, 5 mm in diameter and 10 mm in thickness, made of molybdenum was connected to the coil and also buried. The resulting powder body in which the coil and the electrode were buried was uniaxially press molded to obtain a discoidal molding. At that time, the coil brined in the molding took a swirling planar shape.

An aluminum nitride sintered body was obtained by holding the the resulting discoidal molding at 1800° C. under pressure of 300 kg/cm$^2$ for 2 hours according to the hot press. In the aluminum nitride sintered body, the above resistive heat generator and the molybdenum electrode were buried. This molybdenum electrode can be used as an electrostatic chucking electrode or a high frequency electrode.

In the following, the third aspect of the present invention will be explained.

During the course of investigating aluminum nitride sintered bodies, the present inventors have succeeded in producing a blackish gray to blackish brown aluminum nitride sintered body containing almost no metallic element such as a sintering aid or a blacking agent other than aluminum and having a extremely low lightness with a black color of not more than lightness N 4 specified in JIS Z 8721.

Since this aluminum nitride sintered body exhibits the black having not more than the lightness N 4 specified in JIS Z 8721 as a preferred embodiment, the sintered body has a large radiation heat amount and an excellent heating characteristic. Therefore, such a sintered body is suitable as a substrate constituting a heating material for a ceramic heater, susceptor, etc. In addition, since the content of the metal element(s) other than aluminum can be made extremely small, it is not feared that a semiconductor wafer is contaminated with such a metallic element. In particular, it is not feared that the sintered body will afford an adverse effect upon the semiconductor wafer or an apparatus therefor. Furthermore, a variation in color at the surface of the aluminum nitride sintered body according to the present invention is not conspicuous, and appearance of the aluminum nitride sintered body is extremely excellent. In addition, since the sintered body has a high black degree, its commercial value is largely enhanced.

More specifically explaining, the present inventors prepared a raw material composed of powdery aluminum nitride containing 500 ppm to 5000 ppm of carbon, molding it, and sintering the molding at not less than a temperature 1730° C. under pressure of not less than 80 kg/cm$^2$ by the hot press. By so doing, the inventors succeeded in producing the above-mentioned blackish brown to blackish gray aluminum nitride substrate having a small lightness.

The raw material composed of the powdery aluminum nitride containing 500 ppm to 5000 ppm of carbon may be produced by any one of the following methods.

(1) To powdery aluminum nitride is added a given amount of a carbon source to adjust the content of carbon in the powder to 500 ppm–5000 ppm.

(2) A raw material composed of the powdery aluminum nitride having the carbon content of 500 ppm to 5000 ppm is produced by mixing plural kinds of aluminum nitride powders having different carbon contents at a given ratio. In this case, three or more kinds of aluminum nitride powders may be mixed. However, as a preferred embodiment, a raw material composed of the powdery aluminum nitride having the carbon content of 500 ppm to 5000 ppm is produced by mixing a first aluminum nitride powder having a lower carbon content with a second aluminum nitride having a higher carbon content at a given ratio.

In this way, the present inventors succeeded in stably producing the aluminum nitride sintered body having low lightness by sintering the aluminum nitride powder containing carbon at a given ratio in a given temperature range under high pressure. If the content of carbon is less than 500 ppm, the lightness of the sintered body increases, whereas if the content of carbon is more than 5000 ppm, the relative density of the aluminum nitride sintered body is decreased to less than 92%, and its hue is gray.

It was clarified that if the firing temperature is less than 1730° C., the densification of the sintered body is not sufficient so that the aluminum nitride sintered body may be white and its lightness may rise to not less than 7. On the other hand, if the firing temperature of the above powder is more than 1920° C., a polytype phase is produced so that the lightness of the aluminum nitride sintered body may rise. When the firing temperature was in a range of 1750° C. to 1900° C., the lightness of the aluminum nitride sintered bodies were particularly decreased.

If te firing pressure is less than 80 kg/cm$^2$, it was clarified that an AlN—Al$_2$CO crystalline phase is produced or a polytype phase is produced in addition to AlN—Al$_2$CO crystalline phase so that the lightness of the aluminum nitride sintered body may increase. For a reason mentioned later, this pressure is preferably not less than 150 kg/cm$^2$ and more preferably not less than 200 kg/cm$^2$. Judging from the ability of the actual production apparatus, this pressure is preferably not more than 0.5 ton/cm$^2$.

The aluminum nitride sintered body preferably exhibits a black color having a lightness N 3 specified in JIS Z 8721.

Addition of a metal element other than aluminum to powdery aluminum nitride should be avoided, and such a metal element is preferably not more than 100 ppm. The "metal element other than aluminum" means metal elements belonging to Groups Ia–VIIa, VIII, Ib, and IIb and part of Groups IIIb and IVb (Si, Ga, Ge, etc.) in the Periodic Table.

Further, the present inventors confirmed that high purity aluminum nitride sintered bodies each having not more than a lightness N 4 can be produced even by the hot isostatic press under the same condition as given above so long as the above temperature and pressure requirements are met.

The present inventors investigated the reason why the aluminum nitride sintered body produced as mentioned above had a high black degree and low lightness. As a result, the present inventors has discovered the following fact, and come to accomplished the present invention.

Figure 20:
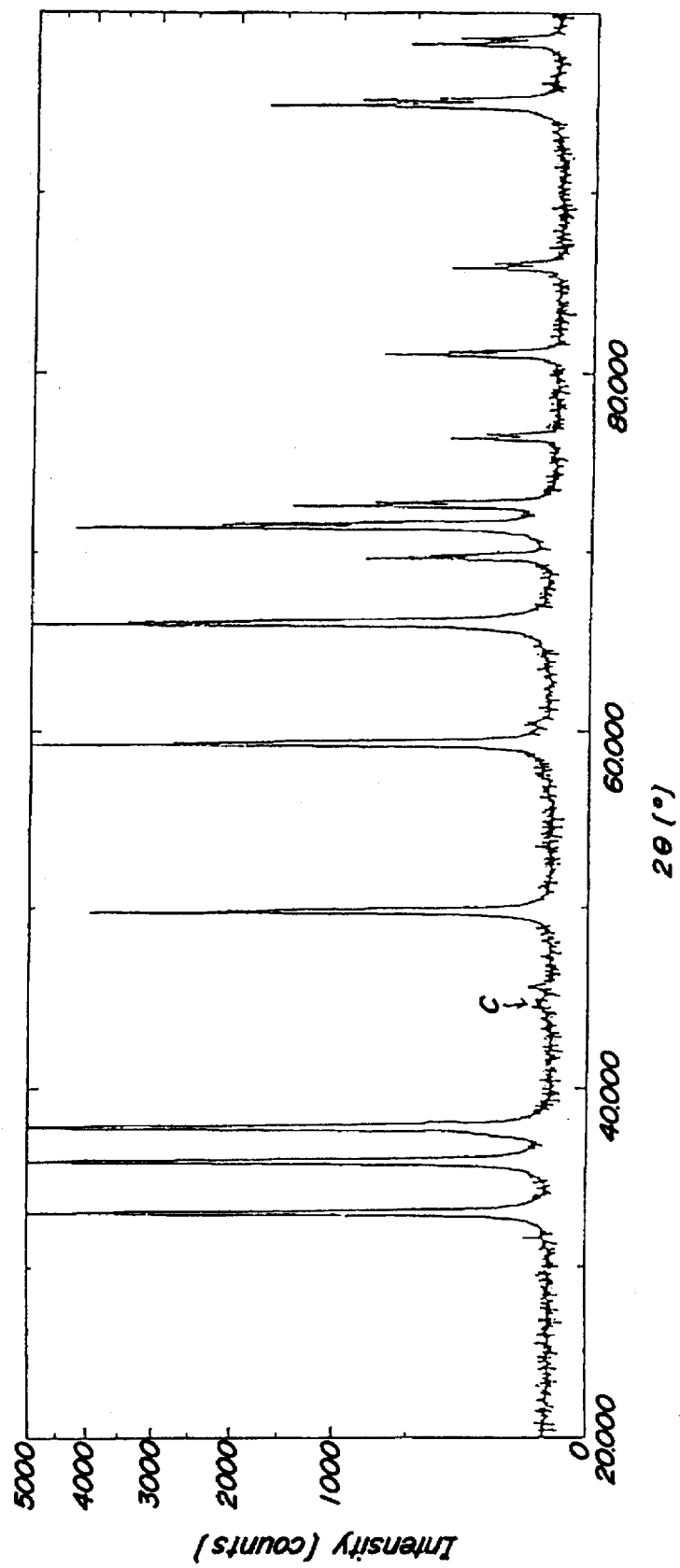
FIG. 20 is a spectrum chart of a X-ray diffraction analysis of an aluminum nitride sintered body of one embodiment of the third aspect of the present invention.

More specifically, in the samples having the blackish brown or the blackish gray with not more than the lightness N 4, the main crystalline phase was AlN, and AlON was produced as an auxiliary crystalline phase, but no other crystalline phase could not be found. With respect to this, the X-ray diffraction analysis was effected. For example, as shown in FIG. 20, it was clarified that peaks of carbon clearly appeared. This shows that a carbon phase was produced in addition of the main AlN crystalline phase and the AlON crystalline phase.

In this X-ray diffraction analysis chart, a peak corresponding to a c-axis face was not detected. This means that the number of laminated layers of a laminated structure made of carbon atoms is only a few, and thus the thickness of the carbon layer structure is extremely thin. It is considered that the carbon exists near the grain boundary of the AlN crystalline phase.

Figure 21:
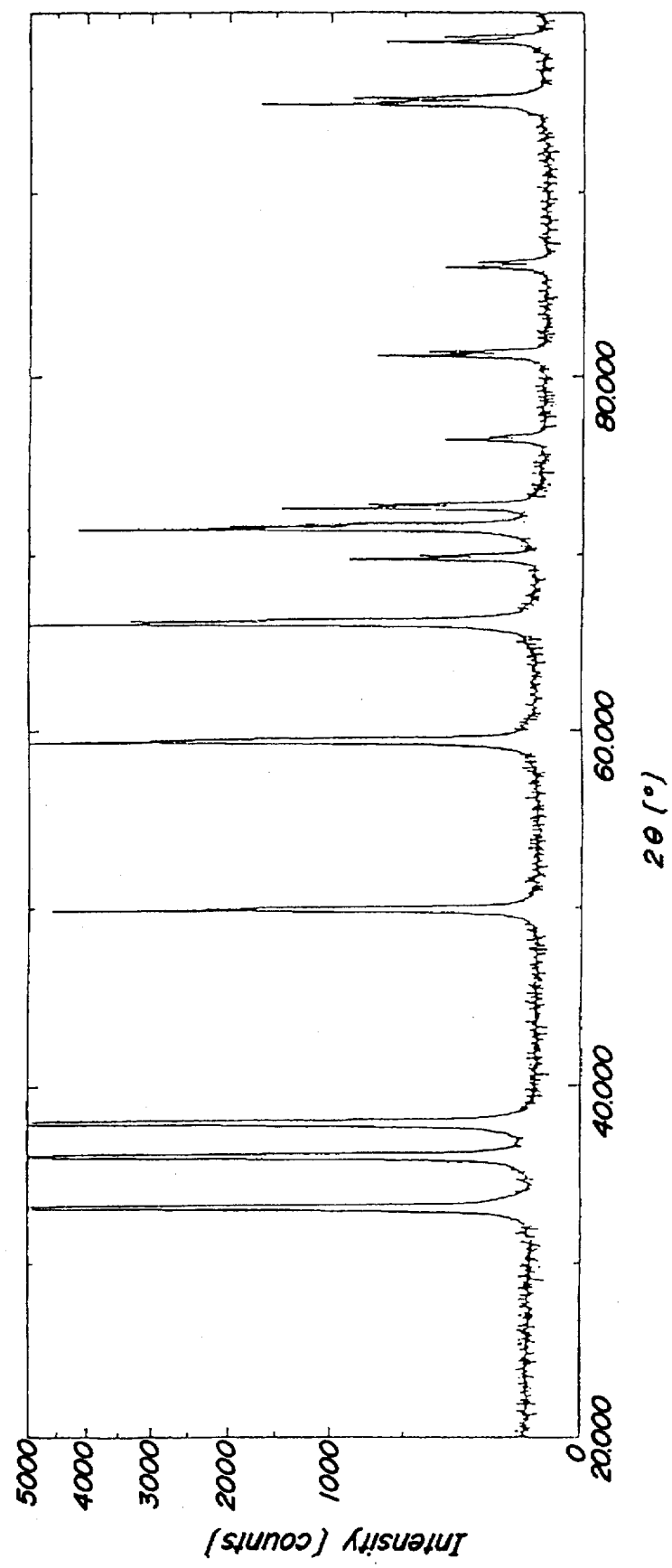
FIG. 21 is a spectrum chart of a X-ray diffraction analysis of an aluminum nitride sintered body as a comparative example.

When the above sample having the low lightness was heated, for example, at 1850° C. in nitrogen atmosphere, as is seen from an X-ray diffraction chart shown in FIG. 21, the AlN crystalline phase remains, but none of the AlON phase and the carbon appear and were detected. This is considered in that oxygen in AlON phase and the carbon are solid solved into the AlN crystal grains. For example, the N-sites are substituted by oxygen atoms so that a color center may be formed to absorb a light in a short wavelength range.

Figure 22:
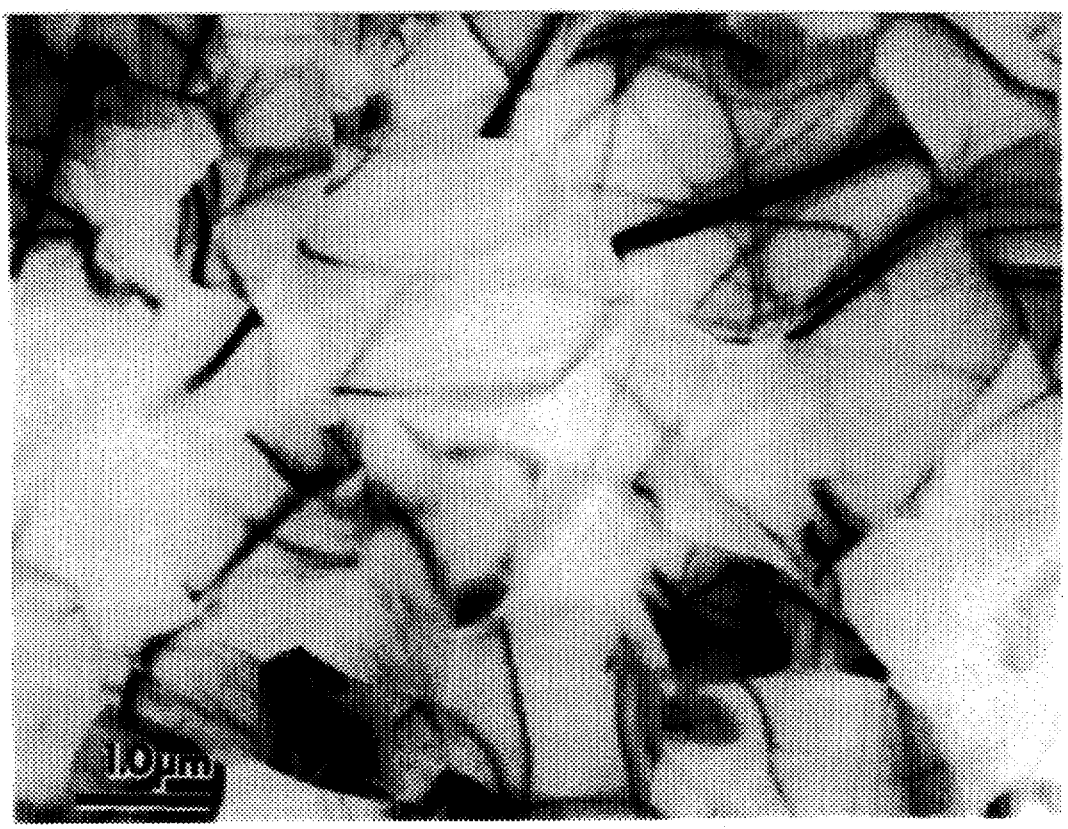
FIG. 22 is an electron microphotograph showing a ceramic tissue of an aluminum nitride sintered body according to another embodiment of the third aspect of the present invention.
Figure 23:
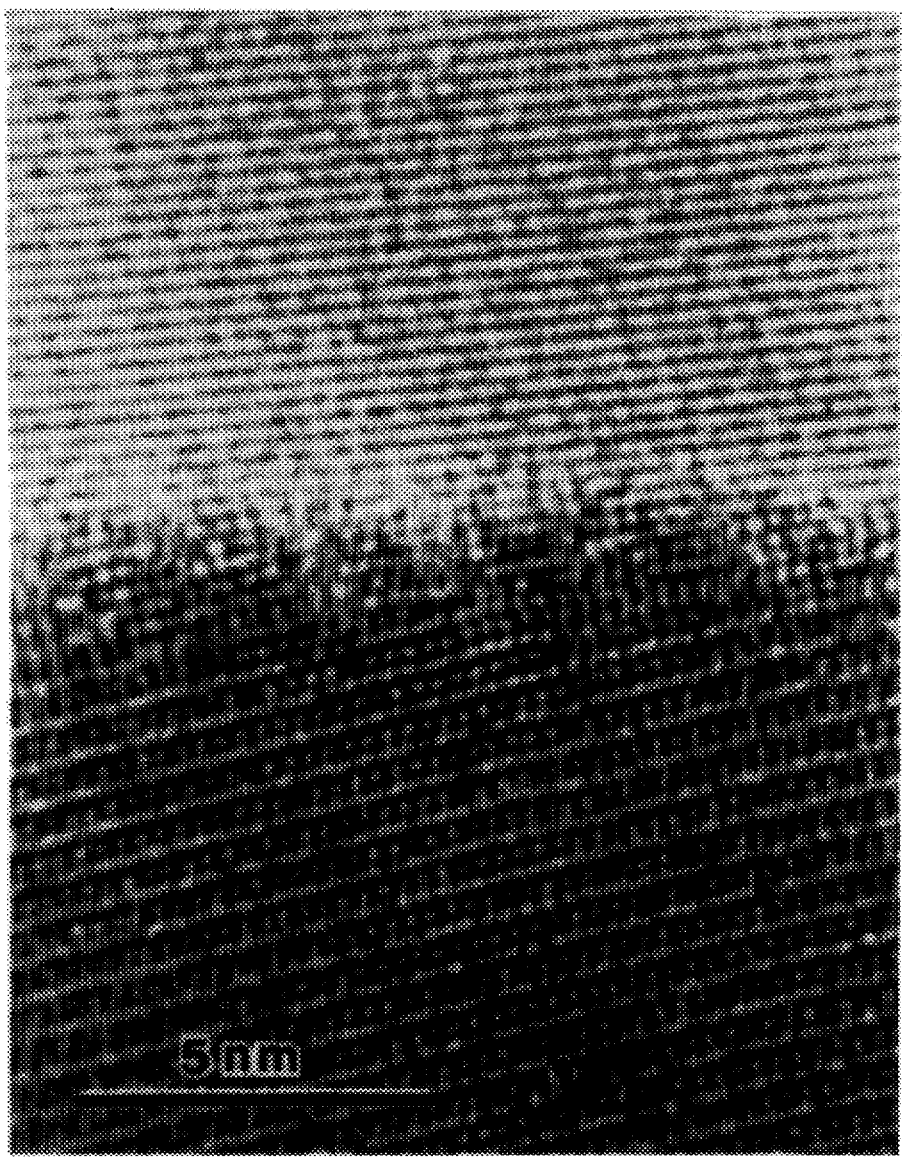
FIG. 23 is an electron microphotograph showing a ceramic tissue near a grain boundary of a grain of an AlN crystalline phase of the aluminum nitride sintered body according to another embodiment of the third aspect of the present invention.
Figure 24:
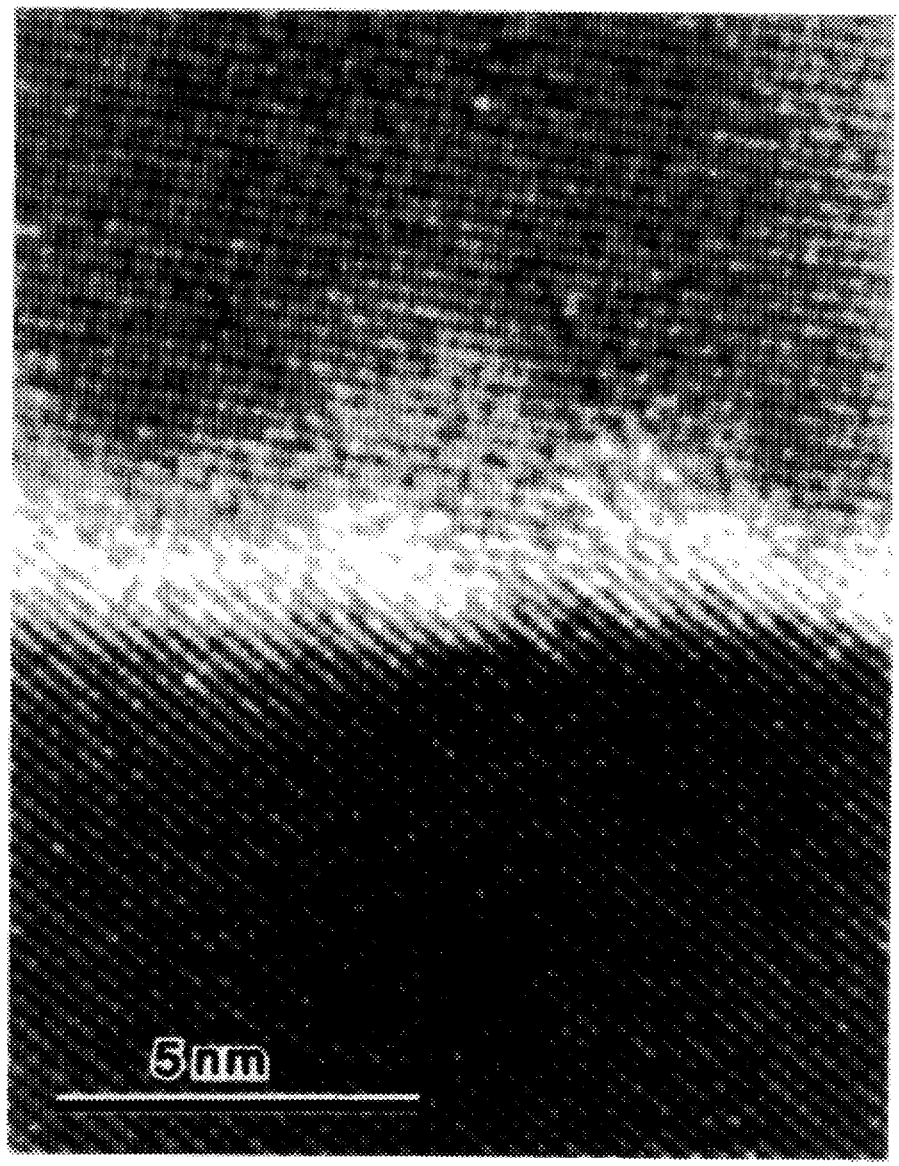
FIG. 24 is an electron microphotograph showing a ceramic tissue near a grain boundary of a grain of an AlN crystalline phase of the aluminum nitride sintered body as the comparative example.

The microstructure of the above-mentioned aluminum nitride is shown in FIG. 22. As shown in FIG. 22, very small AlON crystals exist in the AlN crystal grain, almost no grain boundary is seen between the crystalline phases, and a grain boundary portion at which the crystals contact is dense and has no gap. FIG. 23 is an electron microphotograph of an aluminum nitride sintered body falling in the scope of the present invention in which a grain boundary portion of a crystal composed of AlN is enlarged. FIG. 24 is an electron microphotograph of a yellowish white sample in which a grain boundary portion of a AlN crystal is enlarged. No different phase is seen between the AlN crystals.

As the process for the production of aluminum nitride powder, the reducing/nitriding process and a directly nitriding process are known. According to the present invention, the aluminum nitride sintered body having the low lightness can be produced by employing the powdery raw material prepared by either one of these processes. Chemical reactions used in these processes are given below.

Reducing/nitriding process:

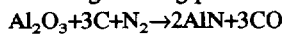

Direct nitriding process:

i) 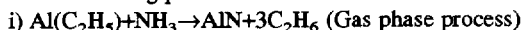 (Gas phase process)

ii) 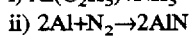

When the aluminum nitride powder is to be sintered, carbon is added into the powder at a given ratio, and the mixture is heated and sintered under high pressure. At that time, $Al_2O_3$ existing near the surface of the aluminum nitride powder is reduced with the carbon added, thereby producing AlN. It is considered that during when this reduction proceeds according to the below-mentioned formulae (1), (2) and (3), a band is formed on the surface of the ALN grain so that the band may continuously absorb a visible light over a wide range to lower the lightness. However, the carbon phase must remain near the grain boundary at the point of this time. It is considered that if the firing temperature exceeds and becomes higher than 1950° C., the production of the $Al_2O$ phase proceeds according to a formula: $Al_2O + C \rightarrow Al_2OC$ to decrease the carbon phase, and accordingly the relatively unstable band on the surface of the AlN grain formed according to the formulae (1), (2) and (3) decreases. Further, it is considered that if the holding time is too long, the carbon similarly decreases.

 (1)

 (2)

 (3)

The aluminum nitride sintered body according to the present invention ordinary possesses the main crystalline phase of AlN, an auxiliary crystalline phase of AlON and a carbon phase. It is preferable that the sintered body contains substantially no $(AlN)x(Al_2OC)_{1-x}$ phase, and has not more than the lightness N 4 specified in JIS Z 8721.

That is, when powdery aluminum nitride is sintered under pressure of about 80 to 100 kg/cm², a gray aluminum nitride sintered body having a lightness N 4 to N 5 is produced in some cases. The X-ray diffraction analysis result and other spectrum analysis results of the resulting crystalline phase revealed that the resulting matrix fundamentally includes the main crystalline phase of AlN, the auxiliary crystalline phase and the carbon phase. On the other hand, if a pressure of not less than 150 kg/cm² is employed, the lightness of the sintered body further decreases so that the lightness of not more than N 4 can be stably obtained.

The microstructure of the fundamental matrix, etc. did not differ between the above two cases. However, as shown in electron microphotographs of FIGS. 25 and 26, it was made clear that the $(AlN)_x(Al_2OC)_{1-x}$ phase was slightly produced in the gray product. A very small gap was formed between the AlN crystalline phase and the $(AlN)_x(Al_2OC)_{1-x}$ phase, so that light was scattered in this gap and the scattered light rose the lightness. Therefore, the lightness of the aluminum nitride sintered body can be further decreased to not more than N 4, and furthermore to not more than N 3.5 by preventing the production of the $(AlN)_x(Al_2OC)_{1-x}$ phase.

The following can be favorably used as a carbon source to be added to powdery aluminum nitride.

(1) A resin containing carbon. For example, a flying powdery organic resin composed of such as a phenol resin.

(2) Powdery carbon such as carbon black, graphite or the like (3) An intermediate product of aluminum nitride produced during a course of the reducing/nitriding process or the like and having a high concentration of carbon.

The aluminum nitride powder and the carbon source can be mixed by dry type mixing such as a dry type bag, a ball mill or a vibration mill, or by a wet type mixing using an organic solvent.

The aluminum nitride sintered body according to the present invention has a large heat radiation amount and excellent heating characteristic. Further, since the sintered body has almost no conspicuous variation in color at the surface and is blackish brown or blackish gray, its commercial value is high. Accordingly, the aluminum nitride sintered body can be used suitably particularly for various heating apparatuses. Furthermore, since the aluminum nitride sintered body according to the present invention does not use a sintering aid or a blacking agent as a feed source of a metal element besides aluminum and the content of the metal atoms beside aluminum can be suppressed to not more than 100 ppm, it causes no contamination. Therefore, the sintered body is most suitable as a material for high purity processing. In particular, the sintered body will not afford any serious adverse effect upon the semiconductor wafer or its apparatus itself in the semiconductor-producing process.

In the following, more specific experimental results will be explained.

Experiment A

Each of aluminum nitride sintered bodies in Test Runs A1 to A12 in Tables 5 and 6 was actually produced as follows. As a raw material of aluminum nitride, high purity powder produced by the reducing/nitriding process or the direct nitriding process was used. In each powder, the content of each of Si, Fe, Ca, Mg, K, Na, Cr, Mn, Ni, Cu, Zn, W, B and Y was not more than 100 ppm, and no other metal was detected besides those metals and aluminum. With respect to each Test Run, the content of carbon is shown in Tables 5 and 6.

A preliminarily molded body having a discoidal shape was produced by uniaxially press molding each raw material powder. The molding was fired in a sealed state by the hot press. The firing temperature, the holding time period at this firing temperature and the pressure in the firing stage were varied as shown in Tables 5 and 6. The main crystalline phase and other crystalline phase of each aluminum nitride sintered body were measured by the X-ray diffraction analysis. Further, the relative density of the sintered body was calculated by bulk density/theoretical density, and the bulk density was measured by the Archimedean method. Since no sintering aid having a large density was not contained, the theoretical density of the sintered body is 3.26 g/cc. The content of carbon in the sintered body was measured by an elemental analysis. The hue of the sintered body was visually determined, and the lightness of the sintered body was measured according to the above-mentioned process. These results are also shown in Tables 5 and 6.

TABLE 5

| | Test Run No. | | | | | |
|---|---|---|---|---|---|---|
| | A1 | A2 | A3 | A4 | A5 | A6 |
| AlN powder | Nitriding under reduction | Nitriding under reduction | Nitriding under reduction | Nitriding under reduction | Nitriding under reduction | Nitriding under reduction |
| Content of carbon (ppm) | 150 | 500 | 750 | 750 | 750 | 750 |
| Firing temperature (°C.) | 1800 | 1800 | 1700 | 1750 | 1850 | 1800 |
| Holding time (hr.) | 2 | 1 | 2 | 2 | 2 | 3 |
| Pressure (kg/cm$^2$) | 200 | 100 | 200 | 150 | 50 | 200 |
| Main crystalline phase | AlN | AlN | AlN | AlN | AlN | AlN |
| Other crystal(s) | ALON | ALON carbon | ALON | ALON carbon | ALON carbon AlN—Al$_2$CO | ALON carbon |
| Relative density (%) | 99.5 | 98.0 | 97.0 | 98.5 | 97.0 | 99.5 |
| Content of carbon in sintered body (ppm) | 150 | 500 | 740 | 750 | 750 | 750 |
| Hue of sintered body | gray | dark gray | white | dark gray | gray | dark gray |
| Lightness of sintered body | N5.0 | N3.5 | N8.5 | N4.0 | N5.0 | N3.0 |

TABLE 6

| | Test Run No. | | | | | |
|---|---|---|---|---|---|---|
| | A7 | A8 | A9 | A10 | A11 | A12 |
| AlN powder | Direct nitriding | Nitriding under reduction | Nitriding under reduction | Nitriding under reduction | Direct nitriding | Nitriding under reduction |
| Content of carbon (ppm) | 750 | 750 | 1000 | 5000 | 5000 | 10000 |
| Firing temperature (°C.) | 1930 | 1950 | 1800 | 1800 | 1800 | 1800 |
| Holding time (hr.) | 1 | 4 | 2 | 2 | 2 | 2 |
| Pressure (kg/cm$^2$) | 200 | 150 | 200 | 250 | 250 | 200 |
| Main crystalline phase | AlN ALON | AlN | AlN ALON | AlN ALON | AlN ALON | AlN ALON |
| Other crystal(s) | carbon | | carbon | carbon | carbon | carbon |
| Relative density (%) | 95.0 | 99.5 | 97.0 | 95.0 | 92.0 | 90.0 |
| Content of carbon in sintered body (ppm) | 750 | 700 | 950 | 4800 | 4900 | 9800 |
| Hue of sintered body | dark gray | milky white | dark gray | dark gray | dark gray | gray |
| Lightness of sintered body | N4.0 | N8.0 | N3.5 | N3.5 | N4.0 | N5.0 |

In Test Run A1 falling outside the scope of the present invention, the content of carbon was 150 ppm, the firing temperature 1800° C., and the pressure 200 kg/cm². In the resulting sintered body, a crystalline phase other than the AlN crystalline phase was AlON alone, and no carbon phase was detected by the X-ray diffraction analysis. The hue of the sintered body was gray. In Test Run A2 falling inside the scope of the present invention, the content of carbon was 500 ppm, the firing temperature 1800° C., and the pressure 100 kg/cm². In the resulting sintered body, the AlON crystalline phase and the carbon phase were detected. The hue of the sintered body was blackish gray, and the lightness was N 3.5. In Test Run A3 falling outside the scope of the present invention, the content of carbon was 750 ppm, the firing temperature 1700° C., and the pressure 200 kg/cm². In the resulting sintered body, no carbon phase was detected. The hue of the sintered body was white.

In Test Run A4 falling inside the scope of the present invention, the content of carbon was 750 ppm, the firing temperature 1750° C., and the pressure 150 kg/cm². In the resulting sintered body, the AlON crystalline phase and the carbon phase were detected. The hue of the sintered body was blackish gray, and the lightness was N 4. In Test Run A5 falling inside the scope of the present invention, the content of carbon was 750 ppm, the firing temperature 1850° C., and the pressure 50 kg/cm². In the resulting sintered body, the $(AlN)_x(Al_2OC)_{1-x}$ phase was detected in addition to the AlON crystalline phase and the carbon phase. Accordingly, the hue of the sintered body was gray, but as mentioned above, it was confirmed that the black coloring of the matrix conspicuously proceeded. Excellent results were obtained with respect to Test Runs A6 and A7 falling inside the scope of the present invention.

In Test Run A8 falling outside the scope of the present invention, the content of carbon was 750 ppm, the firing temperature 1950° C., and the pressure 150 kg/cm². In the resulting sintered body, a polytype existed besides the AlN crystalline phase. The hue of the sintered body was milky white, and the lightness was N8. In Test Runs A9, A10 and A11 falling inside the scope of the present invention, excellent test results were obtained. In Test Run 12 falling in the scope of the present invention, the content of carbon was 10000 ppm, the firing temperature 1800° C., and the pressure 200 kg/cm². In the resulting sintered body, the carbon phase was produced, and the black coloring of the matrix conspicuously proceeded. However, since the porosity increased, the lightness of the entire sintered body accordingly increased to N5.

Among them, an X-ray diffraction chart of the sintered body of Test Run A6 is shown in FIG. 20. Respective peaks representing the AlN, AlNO and carbon phases are confirmed. Further, FIG. 22 is an electron microphotograph showing a ceramic tissue of a sintered body of Test Run A6. FIG. 23 shows the ceramic tissue near the grain boundary. With respect to the sintered bodies in Test Runs A2, A4, A7, A9, A10 and A11, similar X-ray diffraction charts and crystalline tissues were confirmed.

Figure 25:
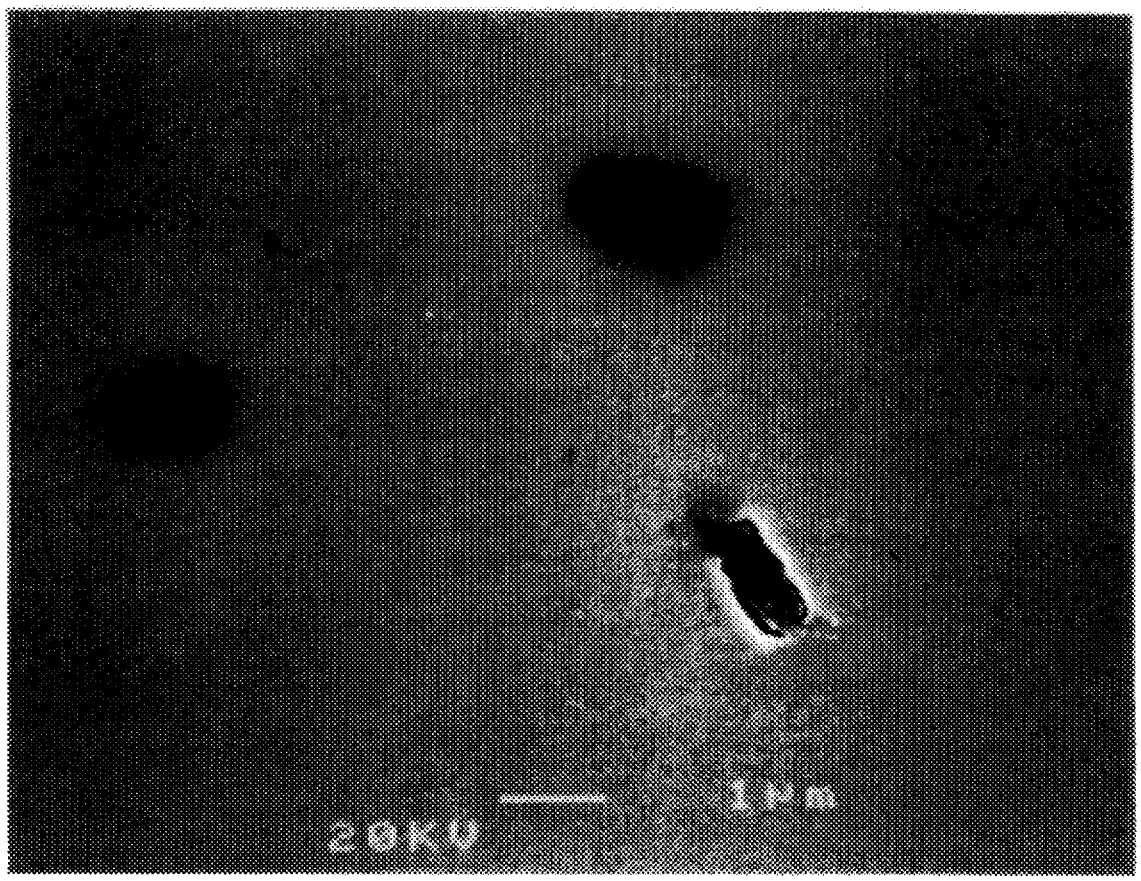
FIG. 25 is an electron microphotograph showing a ceramic tissue in the state a grain of a $(AlN)_x(AL_2OC)_{1-x}$ phase is produced in a matrix composed of particles of an AlN crystalline phase.
Figure 26:
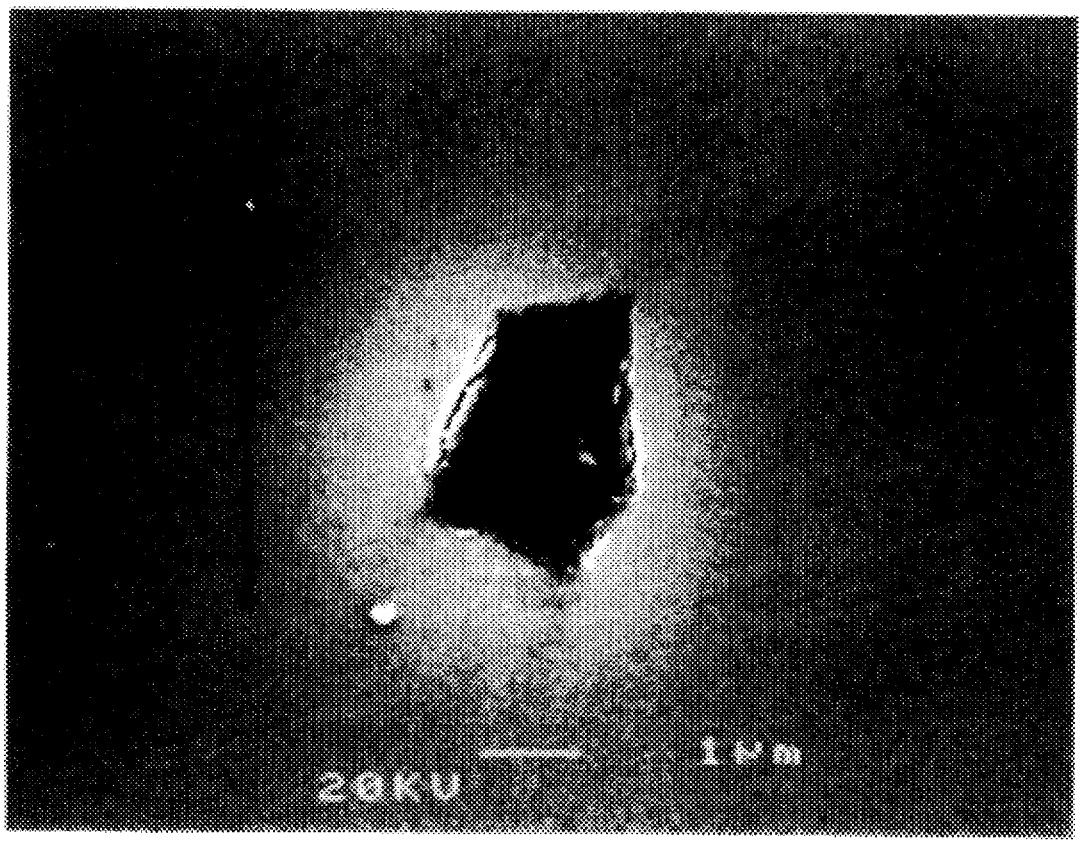
FIG. 26 being an electron microphotograph showing the ceramic tissue of FIG. 25 in which the matrix and the grain of the $(AlN)_x(AL_2OC)_{1-x}$ phase are enlarged.

FIG. 25 shows a ceramic tissue of the sintered body in Test Run A5, and FIG. 26 shows an enlarged view thereof. With respect to this tissue, the X-ray diffraction analysis result of the matrix portion and the analysis result of a visible light absorption spectrum were similar to those of Test Run A6. However, the $(AlN)_x(Al_2OC)_{1-x}$ phase looking black exists in this matrix, so that a slight gap exists between this crystalline grain and the AlN crystal and the light is scattered in this gap to make the sintered body white. The matrix tissue of this sintered body is fundamentally the same as that of the aluminum nitride sintered body according to the present invention, and the black coloring proceeded when considered relatively. However, the lightness of the sintered body was raised to N 5 due to the above scattered light.

Next, the sintered body in Test Run A6 was experimentally thermally treated in nitrogen atmosphere. When this sintered body was thermally treated at 1850° C. for 2 hours, only an outer peripheral portion of the sintered body was changed to a yellowish white color, but the hue and the lightness of a central portion did not change. The X-ray diffraction analysis of the yellowish white-colored portion revealed that its main crystalline phase was an AlN crystalline phase, and the peaks corresponding to the AlON phase and carbon, respectively disappeared and none of these peaks were detected. No change was observed with respect to the relative density and the lattice constant ratio.

It is considered that near the surface of the sintered body in Test Run 6, oxygen in the nitrogen atmosphere, oxygen in the AlON phase and carbon were solid-solved in the AlN crystal grains. It is considered that such reactions more slowly proceed inside the sintered body.

Experiment B

Aluminum nitride sintered bodies in Test Runs B1 to B15 in Tables 7, 8 and 9 were actually produced in the same manner as in Test Runs A1–A12. As a raw material of aluminum nitride, high purity powders produced by the reducing/nitriding process or the direct nitriding process were used. In each powder, the content of each of Si, Fe, Ca, Mg, K, Na, Cr, Mn, Ni, Cu, Zn, W, B and Y was not more than 100 ppm, and no other metal was detected besides those metals and aluminum.

In Test Run B1, powdery aluminum nitride (carbon content: 500 ppm) obtained by the reducing/nitriding process. In the other Test Runs, an additive having a larger content of carbon was added to one having a smaller content of carbon. As such an additive, a resin was used in some Test Runs, and aluminum nitride powder having a larger content of carbon was used in the other Test Runs. As the above resin, phenol resin powder was used, and its addition amount is shown. As the above alumina nitride powder, the one obtained by the reducing/nitriding process was used, and its content of carbon and an addition amount thereof are shown. The entire content of carbon (ppm) of each mixed raw material powder is shown.

A preliminarily molded body having a discoidal shape was produced by uniaxially press molding each raw material powder. The molding was fired in a sealed state by the hot press. The firing temperature, the holding time period at this firing temperature and the pressure in the firing stage were varied as shown in Tables 7, 8 and 9. The main crystalline phase and other crystalline phase of each aluminum nitride sintered body in Test Runs were measured by the X-ray diffraction analysis. Further, the relative density, the hue and the lightness of the sintered body were measured in the same manners as in Test Runs A1–A12. Results are shown in Tables 7, 8 and 9.

TABLE 7

| | \multicolumn{5}{c}{Test Run No.} | | | | |
|---|---|---|---|---|---|
| | B1 | B2 | B3 | B4 | B5 |
| AlN powder | Nitriding under reduction | Nitriding under reduction | Nitriding under reduction | Nitriding under reduction | Nitriding under reduction |
| Content of carbon | 500 | 400 | 500 | 700 | 700 |
| Additive | — | AlN powder | resin | AlN powder | AlN powder |
| Content of carbon | | 800 | 500000 | 1000 | 10000 |
| Amount of added content (wt %) | | 50 | 0.02 | 10 | 2.5 |
| Total content of carbon | 500 | 600 | 600 | 730 | 930 |
| Firing temperature (°C.) | 1800 | 1800 | 1800 | 1750 | 1800 |
| Holding time (hr.) | 2 | 2 | 1 | 2 | 2 |
| Pressure (kg/cm$^2$) | 200 | 200 | 200 | 200 | 200 |
| Main crystalline phase | AlN | AlN | AlN | AlN | AlN |
| Other crystal(s) | AlON carbon | AlON carbon | AlON carbon | AlON carbon | AlON carbon |
| Relative density (%) | 99.4 | 99.5 | 99.6 | 99.4 | 98.5 |
| Content of carbon in sintered body (ppm) | 500 | 600 | 600 | 720 | 920 |
| Tone of color of sintered body | blackish gray | blackish gray | blackish gray | blackish gray | blackish gray |
| Lightness of sintered body | N4.0 | N4.0 | N4.0 | N4.0 | N4.0 |

TABLE 8

| | \multicolumn{5}{c}{Test Run No.} | | | | |
|---|---|---|---|---|---|
| | B6 | B7 | B8 | B9 | B10 |
| AlN powder | Nitriding under reduction | Nitriding under reduction | Direct nitriding | Nitriding under reduction | Nitriding under reduction |
| Content of carbon | 600 | 500 | 400 | 300 | 300 |
| Additive | resin | resin | AlN powder | AlN powder | AlN powder |
| Content of carbon | 500000 | 500000 | 10000 | 20000 | 20000 |
| Amount of added content (wt %) | 0.05 | 0.05 | 2.5 | 5 | 5 |
| Total content of carbon | 850 | 750 | 640 | 1285 | 1285 |
| Firing temperature (°C.) | 1800 | 1650 | 1800 | 1800 | 1800 |
| Holding time (hr.) | 2 | 1 | 1 | 80 | 70 |
| Pressure (kg/cm$^2$) | 200 | 200 | 250 | 150 | 100 |
| Main crystalline phase | AlN | AlN | AlN | AlN | AlN |
| Other crystal(s) | AlON carbon | AlON | AlON carbon | AlON carbon | AlON carbon AlN—Al$_2$CO |
| Relative density (%) | 98.5 | 95.0 | 95.0 | 97.2 | 98.0 |
| Content of carbon in sintered body (ppm) | 840 | 750 | 640 | 1270 | 1240 |
| Tone of color of sintered body | blackish gray | white | blackish gray | blackish gray | gray |
| Brightness of sintered body | N4.0 | N8.0 | N4.0 | N3.5 | N5.0 |

TABLE 9

| | Test Run No. | | | | |
|---|---|---|---|---|---|
| | B11 | B12 | B13 | B14 | B15 |
| AlN powder | Nitriding under reduction | Nitriding under reduction | Nitriding under reduction | Nitriding under reduction | Nitriding under reduction |
| Content of carbon | 300 | 300 | 300 | 1000 | 4000 |
| Additive | AlN powder | resin | AlN powder | AlN powder | AlN powder |
| Content of carbon | 20000 | 500000 | 50000 | 40000 | 40000 |
| Amount of added content (wt %) | 5 | 0.2 | 3 | 10 | 10 |
| Total content of carbon | 1285 | 1299 | 1791 | 4900 | 7600 |
| Firing temperature (°C.) | 1940 | 1800 | 1800 | 1800 | 1800 |
| Holding time (hr.) | 1 | 2 | 2 | 2 | 2 |
| Pressure (kg/cm$^2$) | 100 | 200 | 200 | 200 | 250 |
| Main crystalline phase | AlN | AlN | AlN | AlN | AlN |
| Other crystal(s) | polytype | AlON carbon | AlON carbon | AlON Al$_2$OC | AlON carbon |
| Relative density (%) | 98.0 | 96.0 | 97.0 | 95.2 | 88.0 |
| Content of carbon in sintered body (ppm) | 1200 | 1280 | 1790 | 4500 | 7200 |
| Tone of color of sintered body | milky white | dark gray | dark gray | gray | |
| Brightness of sintered body | N7.0 | N3.5 | N3.5 | N3.5 | N5.0 |

In Test Run B1 falling in the scope of the present invention, a blackish gray aluminum nitride sintered body was obtained. In each of Test Runs B2, B3, B4, B5 and B6 falling in the scope of the present invention, a blackish gray aluminum nitride sintered body was obtained. In Test Run B7 falling outside the scope of the present invention, since the firing temperature was as low as 1650° C., densification of a sintered body did not proceeded, and no carbon phase was produced, so that the hue of the sintered body was white. In Test Run B8 and B9 falling in the scope of the present invention, blackish gray sintered bodies were obtained. In Test Run B10, although the pressure was 70 kg/cm$^2$, the carbon phase was produced in the resulting sintered body and the black-coloring of the matrix proceeded, whereas the lightness of the entire sintered body rose. In a ceramic tissue of this sintered body was present a (AlN)$_x$(Al$_2$OC)$_{1-x}$ phase looking black. A very small gap existed between this crystal grain and the ALN crystalline phase, and the light was scattered in this gap, so that the sintered body was white.

In Test Run B11 falling outside the scope of the present invention, since the firing temperature was too high, a polytype was except the AlN crystalline phase, and the hue of the sintered body was milky white. In Test Runs B1, B2, B13 and B14 falling in the scope of the present invention, aluminum nitride sintered body having the blackish gray hue were obtained. In Test Run 15 falling in the scope of the present invention, the entire content of carbon in the entire aluminum nitride raw material was 7600 ppm, the AlON crystalline phase and the carbon phase were produced besides the AlN crystalline phase. However, since the sintering degree of the sintered body progressed, the relative density was only 88.0% and the lightness was N 5.

(Wafer-Heating Test)

A plate having a diameter of 210 mm and a thickness of 10 mm was prepared from the aluminum nitride sintered body of Sample A6 according to the present invention, and was placed in a vacuum chamber equipped with a heating mechanism having an infrared lamp unit. A silicon wafer having a diameter of 8 inches was placed on this plate, and thermocouples were fitted to the plate and the silicon wafer to simultaneously measure each of the temperatures thereof. As the infrared lamp unit, twenty of 500 W infrared lamps having an infrared peak around a wavelength of 1 μm and fitted to an reflecting plate made of aluminum were used, and these infrared lamps and the reflecting plate were arranged outside the vacuum chamber.

The infrared beam radiated from each infrared lamp was, directly or indirectly after being reflected from the reflecting plate, led to the aluminum nitride sintered plate through a circular quartz window (diameter: 250 mm, thickness: 5 mm) provided at the vacuum chamber to heat the plate.

In this heating apparatus, each infrared lamp was lit to elevate the temperature of the plate from room temperature to 700° C. in one minute, and the plate was kept at 700° C. for one hour. Thereafter, the infrared lamps were put out, and the plate was gradually cooled. Consequently, the consumption power of the infrared lamps was 8600 W at the maximum, and the temperature could be stably controlled. Further, measurement of the temperature of the silicon wafer revealed that when the temperature of the plate was kept at 700° C., the temperature of the wafer was 611° C.

(Heating Experiment in Comparative Example)

Next, an aluminum nitride powder obtained by the reducing/nitriding process and containing 750 ppm of carbon was used, and a discoidal molding was produced by pressing this powder under pressure of 3 tons/cm$^2$ by the cold isostatic press. This molding was fired at 1900° C. for 2 hours to produce a white aluminum nitride sintered body having a density of 99.4%. By using this sintered body, a silicon wafer-heating experiment was effected in the same manner as mentioned above.

As a result, the consumption power was 10 kw at the maximum, and the time period required to realizing the temperature elevation was longer by around 2 minutes. Further, the infrared lamps were more likely to be wire-cut upon reception of a heat cycle of temperature rising-temperature descending between room temperature and 700° C. Furthermore, measurement of the temperature of the silicon wafer revealed that when the plate was held at 700° C., the temperature of the silicon wafer was 593° C. Thus, it was clarified that as compared with the invention example, the temperature of the silicon wafer was lower.

What is claimed is:

1. An aluminum nitride sintered body, wherein a g-value of an unpaired electron of the aluminum nitride sintered body in a spectrum of an electron spin resonance is not less than 2.0010.

2. The aluminum nitride sintered body set forth in claim 1, wherein said g-value is not less than 2.0040.

3. The aluminum nitride sintered body set forth in claim 1, which comprises a main crystalline phase of AlN and an auxiliary crystalline phase of AlON.

4. The aluminum nitride sintered body set forth in claim 1, which has a lightness specified in JIS Z 8721 being N 4 or less, and does not substantially contain $(AlN)_x(Al_2OC)_{1-x}$ phase.

5. The aluminum nitride sintered body set forth in claim 3, which has a lightness specified in JIS Z 8721 being N 4 or less, and does not substantially contain $(AlN)_x(Al_2OC)_{1-x}$ phase.

6. An aluminum nitride sintered body consisting essentially of Al, N, C, O and unavoidable impurities, wherein a spin amount of aluminum per unit mg in a spectrum of the aluminum nitride sintered body in an electron spin resonance is not more than $5 \times 10^{12}$ spin/mg.

7. An aluminum nitride sintered body, wherein a ratio of I(133)/I(680) is not less than 0.3, said I(133) and I(680) being heights of peaks at 133 $cm^{-1}$ and 680 $cm^{-1}$ in a spectrum of the aluminum nitride sintered body in a laser Raman spectroscopy, respectively.

8. The aluminum nitride sintered body set forth in claim 7, which has said ratio of I(133)/I(680) being not less than 0.4, and a lightness specified in JIS Z 8721 being not more than N 4.

9. The aluminum nitride sintered body set forth in claim 7, which comprises a main crystalline phase of AlN and an auxiliary crystalline phase of AlON.

10. An aluminum nitride sintered body, wherein a peak representing carbon is detected at an X-ray diffraction angle $2\theta = 44°$ to $45°$ in an X-ray diffraction chart of said aluminum nitride sintered body in addition to a peak representing aluminum nitride (AlN) as a main crystalline phase.

11. The aluminum nitride sintered body set forth in claim 10, which comprises a main crystalline phase of AlN, an auxiliary crystalline phase of AlON, and a phase of carbon.

12. The aluminum nitride sintered body set forth in claim 10, which has a lightness specified in JIS Z 8721 being N 4 or less, and does not substantially contain $(AlN)_x(Al_2OC)_{1-x}$ phase.

13. The aluminum nitride sintered body set forth in claim 10, which contains 500 ppm to 5000 ppm of carbon atoms.

14. The aluminum nitride sintered body set forth in claim 12, which contains 500 ppm to 5000 ppm of carbon atoms.

15. A process for producing an aluminum nitride sintered body comprising the step of sintering a raw material comprising powdery aluminum nitride having a content of carbon of 500 ppm to 5000 ppm at a temperature of not less than 1730° C. to not more than 1920° C. under a pressure of not less than 80 $kg/cm^2$, wherein a g-value of an unpaired electron of the aluminum nitride sintered body in a spectrum of an electron spin resonance is not less than 2.0010.

16. The process of claim 15, wherein said raw material is produced by mixing at least first and second kinds of aluminum nitride powders having different contents of carbon.

17. The process of claim 16, wherein said second kind of aluminum nitride powder is produced by a reducing/nitriding process.

18. The aluminum nitride sintered body of claim 1, wherein said sintered body consists essentially of Al, N, C, O and unavoidable impurities.

19. The aluminum nitride sintered body of claim 18, wherein said unavoidable impurities are present in an amount of 100 ppm or less.

20. The aluminum nitride sintered body of claim 1, wherein a spin amount of aluminum per unit mg in a spectrum of the aluminum nitride sintered body in an electron spin resonance is not more than $5 \times 10^{12}$ spin/mg.

21. The aluminum nitride sintered body of claim 20, wherein said sintered body consists essentially of Al, N, C, O and unavoidable impurities.

22. The aluminum nitride sintered body of claim 21, wherein said unavoidable impurities are present in an amount of 100 ppm or less.

23. The aluminum nitride sintered body of claim 6, wherein said unavoidable impurities are present in an amount of 100 ppm or less.

24. The aluminum nitride sintered body of claim 9, wherein said sintered body consists essentially of Al, N, C, O and unavoidable impurities.

25. The aluminum nitride sintered body of claim 24, wherein said unavoidable impurities are present in an amount of 100 ppm or less.

26. The aluminum nitride sintered body of claim 10, wherein said sintered body consists essentially of Al, N, C, O and unavoidable impurities.

27. The aluminum nitride sintered body of claim 26, wherein said unavoidable impurities are present in an amount of 100 ppm or less.

* * * * *